(12) United States Patent
Nozaki et al.

(10) Patent No.: US 11,276,575 B2
(45) Date of Patent: Mar. 15, 2022

(54) LIGHT IRRADIATION TYPE HEAT TREATMENT METHOD AND HEAT TREATMENT APPARATUS

(71) Applicant: SCREEN Holdings Co., Ltd., Kyoto (JP)

(72) Inventors: Yoshihide Nozaki, Kyoto (JP); Tomohiro Ueno, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 127 days.

(21) Appl. No.: 16/690,394

(22) Filed: Nov. 21, 2019

(65) Prior Publication Data

US 2020/0211851 A1 Jul. 2, 2020

(30) Foreign Application Priority Data

Dec. 27, 2018 (JP) .............................. JP2018-244402

(51) Int. Cl.
*H01L 21/00* (2006.01)
*H01L 21/268* (2006.01)
(Continued)

(52) U.S. Cl.
CPC ......... *H01L 21/2686* (2013.01); *G01N 21/55* (2013.01); *H01L 21/324* (2013.01);
(Continued)

(58) Field of Classification Search
None
See application file for complete search history.

(56) References Cited

U.S. PATENT DOCUMENTS

2011/0125443 A1  5/2011  Merkl
2014/0118751 A1  5/2014  Rajagopalan et al.
(Continued)

FOREIGN PATENT DOCUMENTS

JP  2009-231652 A  10/2009
JP  2018-130728 A   8/2018
(Continued)

OTHER PUBLICATIONS

Notification of Reason for Refusal dated Apr. 19, 2021 in corresponding Korean Patent Application No. 10-2019-0171491 with English translation obtained from the JPO.
(Continued)

*Primary Examiner* — Reema Patel
(74) *Attorney, Agent, or Firm* — Ostrolenk Faber LLP

(57) ABSTRACT

Multiple theoretical reflectances determined by simulation for a silicon substrate with thin films of multiple types and thicknesses formed thereon are registered in association with the types and the thicknesses in a database. A carrier storing semiconductor wafers in a lot is transported into a heat treatment apparatus. A reflectance of a semiconductor wafer is measured by applying light to a surface of the semiconductor wafer. The theoretical reflectance of the semiconductor wafer is calculated from the measured reflectance thereof. A theoretical reflectance closely resembling the theoretical reflectance of the semiconductor wafer is extracted from among the multiple theoretical reflectances registered in the database, whereby the type and thickness of the thin film formed on the surface of the semiconductor wafer are specified. Treatment conditions for the semiconductor wafer are determined based on the specified type and thickness of the thin film.

5 Claims, 13 Drawing Sheets

(51) Int. Cl.
*H01L 21/324* (2006.01)
*H01L 21/66* (2006.01)
*G01N 21/55* (2014.01)
*H01L 21/67* (2006.01)

(52) U.S. Cl.
CPC ........ *H01L 21/67115* (2013.01); *H01L 22/10* (2013.01); *H01L 22/12* (2013.01)

(56) References Cited

U.S. PATENT DOCUMENTS

| | | |
|---|---|---|
| 2014/0233043 A1 | 8/2014 | Tsai et al. |
| 2018/0224268 A1 | 8/2018 | Iyechika |
| 2018/0292315 A1 | 10/2018 | Iyechika |

FOREIGN PATENT DOCUMENTS

| | | |
|---|---|---|
| TW | 201418510 A | 5/2014 |
| TW | 201839352 A | 11/2018 |
| WO | WO 2017/061333 A1 | 4/2017 |

OTHER PUBLICATIONS

Office Action dated Oct. 15, 2020 in corresponding Taiwanese Patent Application No. 108142062 and Search Report.

F I G . 6
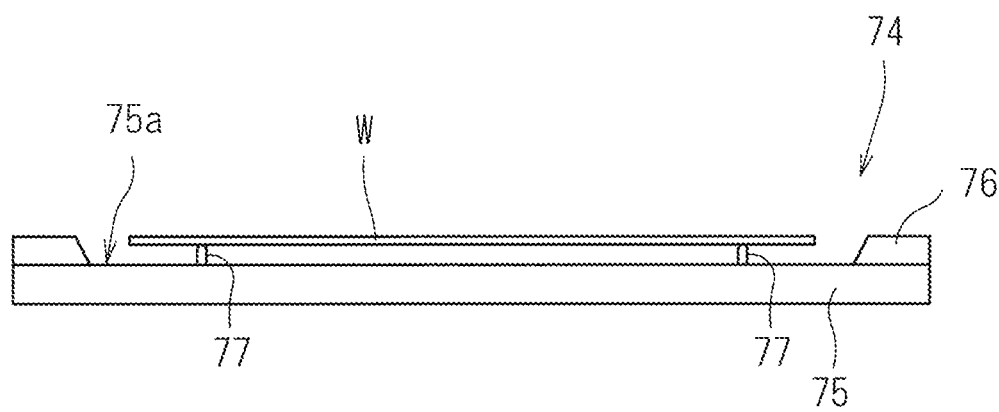

F I G. 8
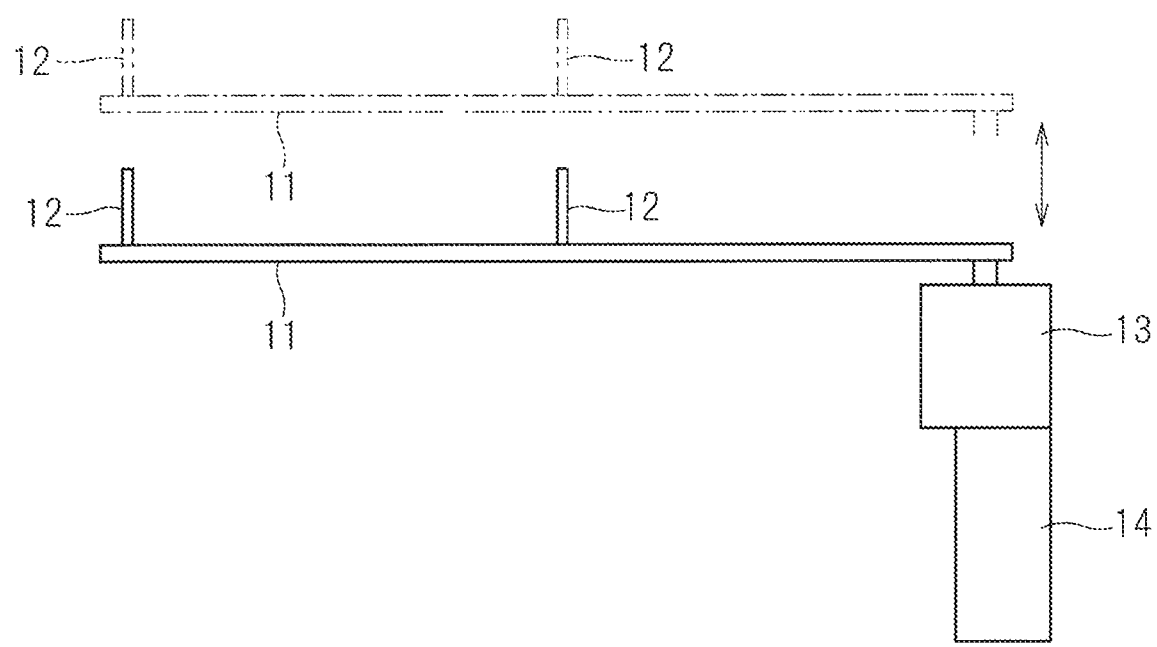

LIGHT IRRADIATION TYPE HEAT TREATMENT METHOD AND HEAT TREATMENT APPARATUS

BACKGROUND OF THE INVENTION

Field of the Invention

The present invention relates to a heat treatment method and a heat treatment apparatus which irradiate a thin plate-like precision electronic substrate (hereinafter referred to simply as a "substrate") such as a semiconductor wafer with a flash of light to heat the substrate.

Description of the Background Art

In the process of manufacturing a semiconductor device, attention has been given to flash lamp annealing (FLA) which heats a semiconductor wafer in an extremely short time. The flash lamp annealing is a heat treatment technique in which xenon flash lamps (the term "flash lamp" as used hereinafter refers to a "xenon flash lamp") are used to irradiate a surface of a semiconductor wafer with a flash of light, thereby raising the temperature of only the surface of the semiconductor wafer in an extremely short time (several milliseconds or less).

The xenon flash lamps have a spectral distribution of radiation ranging from ultraviolet to near-infrared regions. The wavelength of light emitted from the xenon flash lamps is shorter than that of light emitted from conventional halogen lamps, and approximately coincides with a fundamental absorption band of a silicon semiconductor wafer. Thus, when a semiconductor wafer is irradiated with a flash of light emitted from the xenon flash lamps, the temperature of the semiconductor wafer can be raised rapidly, with only a small amount of light transmitted through the semiconductor wafer. Also, it has turned out that flash irradiation, that is, the irradiation of a semiconductor wafer with a flash of light in an extremely short time of several milliseconds or less allows a selective temperature rise only near the surface of the semiconductor wafer.

Such flash lamp annealing is used for processes that require heating in an extremely short time, e.g. typically for the activation of impurities implanted in a semiconductor wafer. The irradiation of a surface of a semiconductor wafer implanted with impurities by an ion implantation process with a flash of light emitted from flash lamps allows the temperature rise only in the surface of the semiconductor wafer to an activation temperature for an extremely short time, thereby achieving only the activation of the impurities without deep diffusion of the impurities.

In general, a controller controls a variety of components in an apparatus for treating a semiconductor wafer in accordance with a recipe which specifies treatment procedures and treatment conditions, whereby a desired treatment is performed. Japanese Patent Application Laid-Open No. 2009-231652 discloses that a controller controls components also in a flash lamp annealer in accordance with a recipe, whereby heat treatment is performed on a semiconductor wafer.

For a flash heating treatment of a semiconductor wafer, it is hence necessary to select and set a recipe which causes a suitable treatment to be performed. Specifically, it is necessary to set a recipe including treatment conditions which cause the temperature of a surface of a semiconductor wafer to exactly reach a target temperature at the time of flash irradiation. The treatment conditions in a recipe to be set are determined by the surface properties of the semiconductor wafer (for example, the type and thickness of a thin film formed on the surface of the semiconductor wafer). In other words, it is necessary to set a recipe including optimum treatment conditions in accordance with the type and thickness of the thin film formed on the surface of the semiconductor wafer.

The type and thickness of the thin film to be formed on the surface of the semiconductor wafer are determined by a film deposition process which precedes the flash heating treatment. Typically, a semiconductor wafer with a thin film of a predetermined type and of a predetermined thickness formed thereon is transported into a flash lamp annealer and becomes subject to the flash heating treatment.

Unfortunately, there are cases in which a semiconductor wafer with a thin film of a type and a thickness different from predetermined ones formed thereon is accidentally transported into the flash lamp annealer and becomes subject to the flash heating treatment. In such cases, it is difficult to check the type and thickness of the thin film formed on the semiconductor wafer already transported into the flash lamp annealer.

SUMMARY

The present invention is intended for a method of heating a substrate by irradiating the substrate with a flash of light.

According to one aspect of the present invention, the method comprises the steps of: (a) measuring a reflectance of a substrate to be treated; (b) calculating a theoretical reflectance of the substrate from the measured reflectance obtained in the step (a); and (c) specifying the type and thickness of a thin film formed on a surface of the substrate, based on the theoretical reflectance calculated in the step (b).

This method is capable of checking the type and thickness of the thin film formed on the surface of the substrate.

The present invention is also intended for a heat treatment apparatus for heating a substrate by irradiating the substrate with a flash of light.

According to another aspect of the present invention, the heat treatment apparatus comprises: a chamber for receiving a substrate to be treated therein; a flash lamp for irradiating the substrate received in the chamber with a flash of light; a reflectance measuring part for measuring a reflectance of the substrate; a reflectance calculating part for calculating a theoretical reflectance of the substrate from the measured reflectance obtained by the reflectance measuring part; and a specifying part for specifying the type and thickness of a thin film formed on a surface of the substrate, based on the theoretical reflectance calculated by the reflectance calculating part.

This heat treatment apparatus is capable of checking the type and thickness of the thin film formed on the surface of the substrate.

It is therefore an object of the present invention to check the type and thickness of a thin film formed on a surface of a substrate.

These and other objects, features, aspects and advantages of the present invention will become more apparent from the following detailed description of the present invention when taken in conjunction with the accompanying drawings.

BRIEF DESCRIPTION OF THE DRAWINGS

FIG. 6 is a sectional view of the susceptor;

FIG. 8 is a side view of the transfer mechanism;

DESCRIPTION OF THE PREFERRED EMBODIMENTS

A preferred embodiment according to the present invention will now be described in detail with reference to the drawings.

Figure 1:
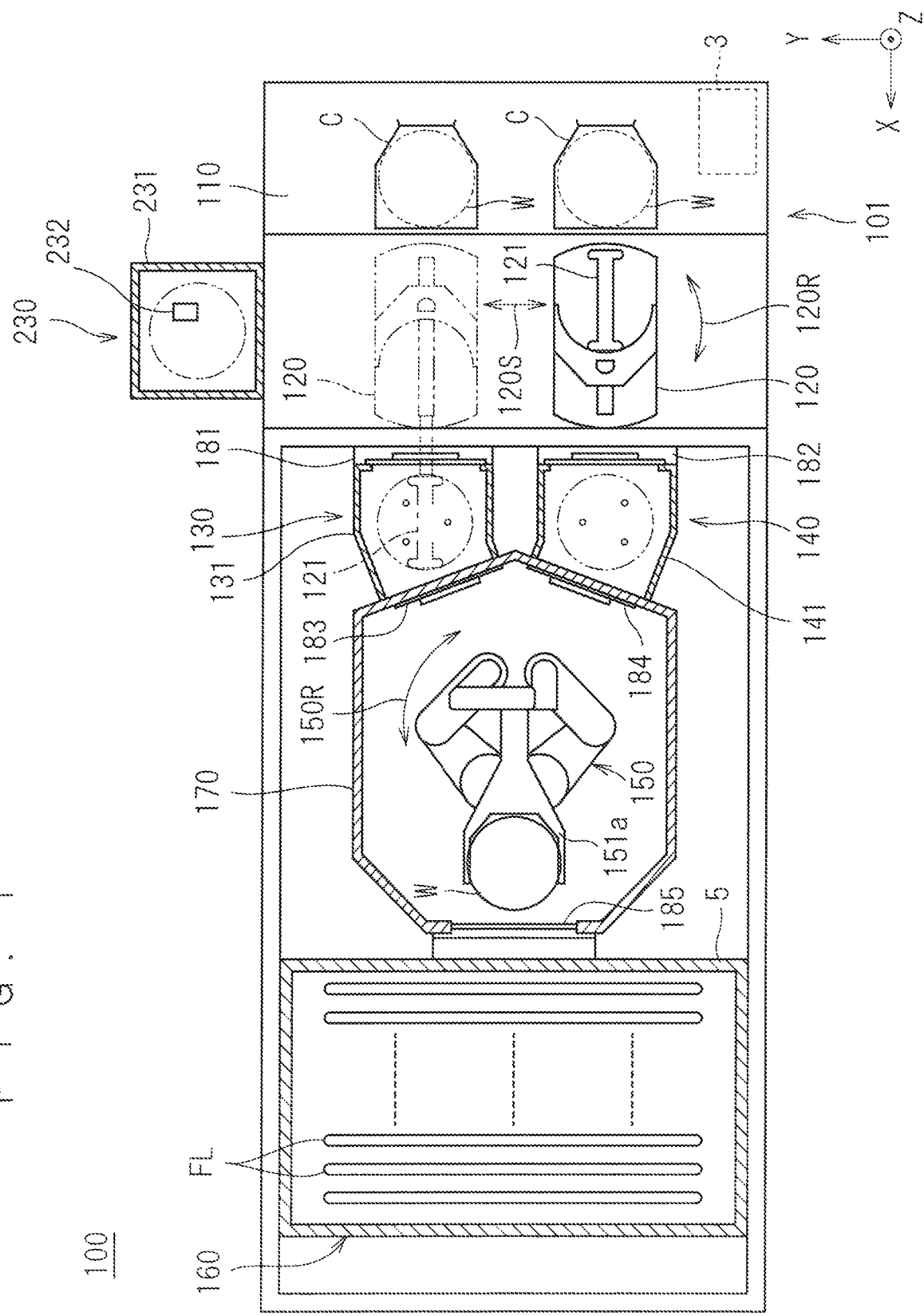
FIG. 1 is a plan view of a heat treatment apparatus according to the present invention.
Figure 2:
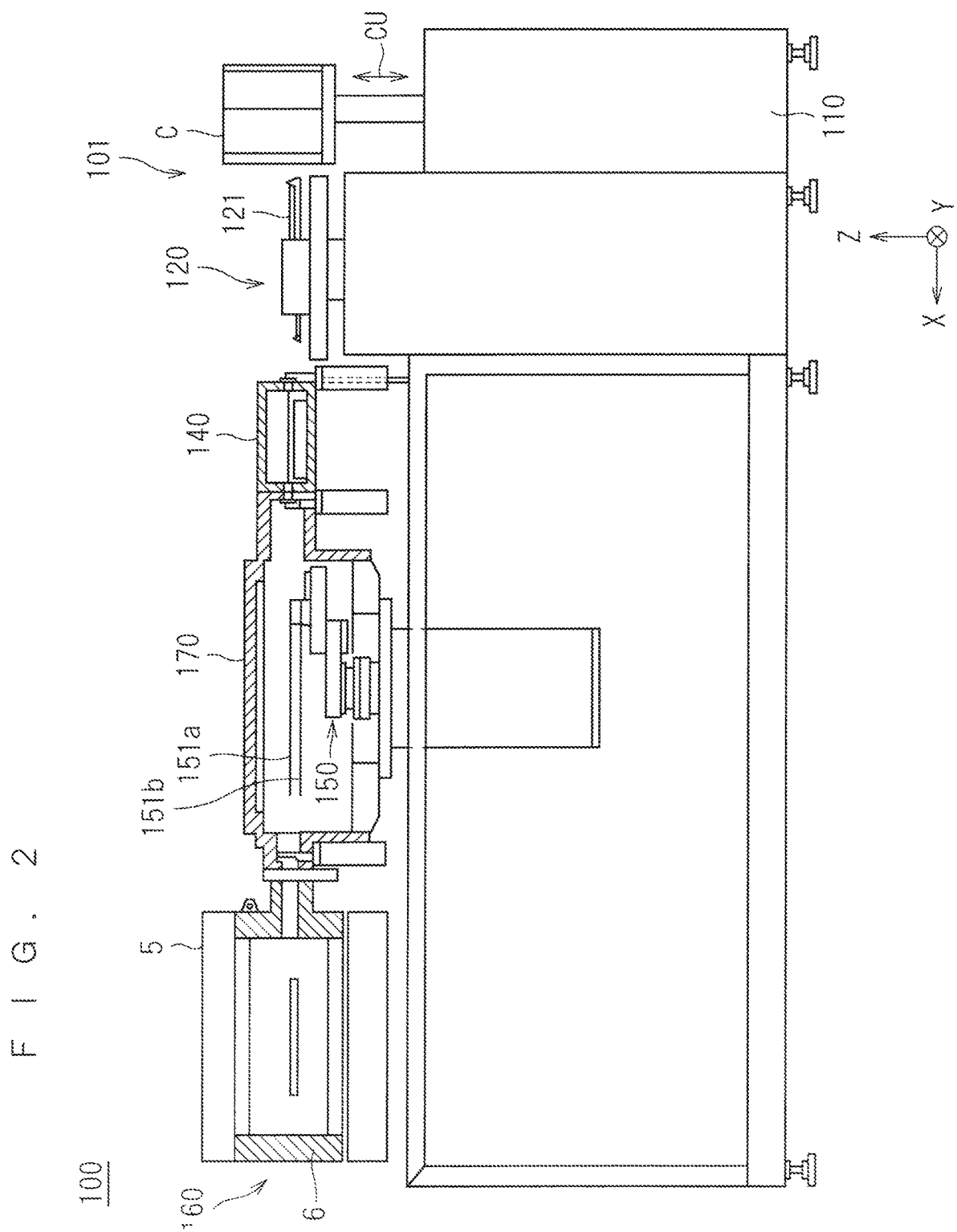
FIG. 2 is a front view of the heat treatment apparatus of FIG. 1.

First, an overall configuration of a heat treatment apparatus according to the present invention will be described. FIG. 1 is a plan view of a heat treatment apparatus 100 according to the present invention, and FIG. 2 is a front view of the heat treatment apparatus 100. The heat treatment apparatus 100 is a flash lamp annealer for irradiating a disk-shaped semiconductor wafer W serving as a substrate with flashes of light to heat the semiconductor wafer W. The size of the semiconductor wafer W to be treated is not particularly limited. For example, the semiconductor wafer W to be treated has a diameter of 300 mm and 450 mm. It should be noted that the dimensions of components and the number of components are shown in exaggeration or in simplified form, as appropriate, in FIG. 1 and the subsequent figures for the sake of easier understanding. An XYZ rectangular coordinate system in which an XY plane is defined as a horizontal plane and a Z axis is defined to extend in a vertical direction is additionally shown in FIGS. 1 to 3 for purposes of clarifying the directional relationship therebetween.

As shown in FIGS. 1 and 2, the heat treatment apparatus 100 includes: an indexer part 101 for transporting untreated semiconductor wafers W from the outside into the heat treatment apparatus 100 and for transporting treated semiconductor wafers W to the outside of the heat treatment apparatus 100; an alignment part 230 for positioning an untreated semiconductor wafer W; two cooling parts 130 and 140 for cooling semiconductor wafers W subjected to the heating treatment; a heat treatment part 160 for performing flash heating treatment on a semiconductor wafer W; and a transport robot 150 for transferring a semiconductor wafer W to and from the cooling parts 130 and 140 and the heat treatment part 160. The heat treatment apparatus 100 further includes a controller 3 for controlling operating mechanisms provided in the aforementioned processing parts and the transport robot 150 to cause the flash heating treatment of the semiconductor wafer W to proceed.

The indexer part 101 includes: a load port 110 for placing thereon a plurality of (in this preferred embodiment, two) carriers (or cassettes) C arranged in juxtaposition; and a transfer robot 120 for taking an untreated semiconductor wafer W out of each of the carriers C and for storing a treated semiconductor wafer W into each of the carriers C. An unmanned transport vehicle (an AGV (automatic guided vehicle) or an OHT (overhead hoist transfer)) or the like transports a carrier C with untreated semiconductor wafers W stored therein to place the carrier C on the load port 110, and carries a carrier C with treated semiconductor wafers W stored therein away from the load port 110.

In the load port 110, the carriers C are movable upwardly and downwardly as indicated by an arrow CU in FIG. 2 so that the transfer robot 120 is able to load any semiconductor wafer W into each carrier C and unload any semiconductor wafer W from each carrier C. The carriers C may be of the following types: an SMIF (standard mechanical interface) pod and an OC (open cassette) which exposes stored semiconductor wafer W to the outside atmosphere, in addition to a FOUP (front opening unified pod) which stores semiconductor wafer W in an enclosed or sealed space.

The transfer robot 120 is slidable as indicated by an arrow 120S in FIG. 1, pivotable as indicated by an arrow 120R in FIG. 1, and movable upwardly and downwardly. Thus, the transfer robot 120 loads and unloads semiconductor wafers W into and from the two carriers C, and transfers semiconductor wafers W to and from the alignment part 230 and the two cooling parts 130 and 140. The operation of the transfer robot 120 loading and unloading the semiconductor wafers W into and from the carriers C is achieved by the sliding movement of a hand 121 of the transfer robot 120 and the upward and downward movement of the carriers C. The transfer of the semiconductor wafers W between the transfer robot 120 and the alignment part 230 or between the transfer robot 120 and the cooling parts 130 and 140 is achieved by the sliding movement of the hand 121 and the upward and downward movement of the transfer robot 120.

The alignment part 230 is provided on and connected to one side of the indexer part 101 in adjacent relation thereto along the Y axis. The alignment part 230 is a processing part for rotating a semiconductor wafer W in a horizontal plane to an orientation appropriate for flash heating. The alignment part 230 includes an alignment chamber 231 which is a housing made of an aluminum alloy, mechanisms (a rotary support part 237 and a rotary motor 238 shown in FIG. 10) provided in the alignment chamber 231 and for supporting and rotating a semiconductor wafer W in a horizontal attitude, a mechanism provided in the alignment chamber 231 and for optically detecting a notch, an orientation flat, and the like formed in a peripheral portion of a semiconductor wafer W, and the like. A reflectance measuring part 232 for measuring the reflectance of a front surface of a semiconductor wafer W supported in the alignment chamber 231 is also provided in the alignment chamber 231. The reflectance measuring part 232 irradiates the front surface of the semiconductor wafer W with light and receives light reflected from the front surface to measure the reflectance of the front surface of the semiconductor wafer W, based on the intensity of the reflected light.

The transfer robot 120 transfers a semiconductor wafer W to and from the alignment part 230. The semiconductor wafer W with the center thereof in a predetermined position is transferred from the transfer robot 120 to the alignment chamber 231. The alignment part 230 rotates the semiconductor wafer W received from the indexer part 101 about a vertical axis passing through the central portion of the semiconductor wafer W to optically detect a notch and the like, thereby adjusting the orientation of the semiconductor wafer W. Also, the reflectance measuring part 232 measures the reflectance of the front surface of the semiconductor wafer W. The semiconductor wafer W subjected to the orientation adjustment is taken out of the alignment chamber 231 by the transfer robot 120.

A transport chamber 170 for housing the transport robot 150 therein is provided as space for transport of the semiconductor wafer W by means of the transport robot 150. A treatment chamber 6 in the heat treatment part 160, a first cool chamber 131 in the cooling part 130, and a second cool chamber 141 in the cooling part 140 are connected in communication with three sides of the transport chamber 170.

The heat treatment part 160 which is a principal part of the heat treatment apparatus 100 is a substrate processing part for irradiating a preheated semiconductor wafer W with flashes of light from xenon flash lamps FL to perform flash heating treatment on the semiconductor wafer W. The configuration of the heat treatment part 160 will be described later in detail.

The two cooling parts 130 and 140 are substantially similar in configuration to each other. The cooling parts 130 and 140 include respective metal cooling plates and respective quartz plates (both not shown) placed on the upper surfaces of the cooling plates in the first and second cool chambers 131 and 141 which are housings made of an aluminum alloy. Each of the cooling plates is temperature-controlled at ordinary temperatures (approximately 23° C.) by a Peltier element or by circulation of constant-temperature water. The semiconductor wafer W subjected to the flash heating treatment in the heat treatment part 160 is transported into the first cool chamber 131 or the second cool chamber 141, and is then placed and cooled on a corresponding one of the quartz plate.

The first cool chamber 131 and the second cool chamber 141 provided between the indexer part 101 and the transport chamber 170 are connected to both the indexer part 101 and the transport chamber 170. Each of the first cool chamber 131 and the second cool chamber 141 has two openings for transporting the semiconductor wafer W thereinto and therefrom. One of the openings of the first cool chamber 131 which is connected to the indexer part 101 is openable and closable by a gate valve 181. The other opening of the first cool chamber 131 which is connected to the transport chamber 170 is openable and closable by a gate valve 183. In other words, the first cool chamber 131 and the indexer part 101 are connected to each other through the gate valve 181, and the first cool chamber 131 and the transport chamber 170 are connected to each other through the gate valve 183.

The gate valve 181 is opened when the semiconductor wafer W is transferred between the indexer part 101 and the first cool chamber 131. The gate valve 183 is opened when the semiconductor wafer W is transferred between the first cool chamber 131 and the transport chamber 170. When the gate valve 181 and the gate valve 183 are closed, the interior of the first cool chamber 131 is an enclosed space.

One of the two openings of the second cool chamber 141 which is connected to the indexer part 101 is openable and closable by a gate valve 182. The other opening of the second cool chamber 141 which is connected to the transport chamber 170 is openable and closable by a gate valve 184. In other words, the second cool chamber 141 and the indexer part 101 are connected to each other through the gate valve 182, and the second cool chamber 141 and the transport chamber 170 are connected to each other through the gate valve 184.

The gate valve 182 is opened when the semiconductor wafer W is transferred between the indexer part 101 and the second cool chamber 141. The gate valve 184 is opened when the semiconductor wafer W is transferred between the second cool chamber 141 and the transport chamber 170. When the gate valve 182 and the gate valve 184 are closed, the interior of the second cool chamber 141 is an enclosed space.

The cooling parts 130 and 140 further include respective gas supply mechanisms for supplying clean nitrogen gas to the first and second cool chambers 131 and 141 and respective exhaust mechanisms for exhausting atmospheres from the first and second cool chambers 131 and 141. The gas supply mechanisms and the exhaust mechanisms may be capable of changing the flow rates thereof in two levels.

The transport robot 150 provided in the transport chamber 170 is pivotable about a vertical axis as indicated by an arrow 150R. The transport robot 150 includes two linkage mechanisms comprised of a plurality of arm segments. Transport hands 151a and 151b each for holding a semiconductor wafer W are provided at respective distal ends of the two linkage mechanisms. These transport hands 151a and 151b are vertically spaced a predetermined distance apart from each other, and are independently linearly slidable in the same horizontal direction by the respective linkage mechanisms. The transport robot 150 moves a base provided with the two linkage mechanisms upwardly and downwardly to thereby move the two transport hands 151a and 151b spaced the predetermined distance apart from each other upwardly and downwardly.

When the transport robot 150 transfers (loads and unloads) a semiconductor wafer W to and from the first cool chamber 131, the second cool chamber 141, or the treatment chamber 6 in the heat treatment part 160 as a transfer target, both of the transport hands 151a and 151b pivot into opposed relation to the transfer target, and move upwardly or downwardly after (or during) the pivotal movement, so that one of the transport hands 151a and 151b reaches a vertical position at which the semiconductor wafer W is to be transferred to and from the transfer target. Then, the transport robot 150 causes the transport hand 151a (or 151b) to linearly slide in a horizontal direction, thereby transferring the semiconductor wafer W to and from the transfer target.

The transfer of a semiconductor wafer W between the transport robot 150 and the transfer robot 120 is performed through the cooling parts 130 and 140. That is, the first cool chamber 131 in the cooling part 130 and the second cool chamber 141 in the cooling part 140 function also as paths for transferring a semiconductor wafer W between the transport robot 150 and the transfer robot 120. Specifically, one of the transport robot 150 and the transfer robot 120 transfers a semiconductor wafer W to the first cool chamber 131 or the second cool chamber 141, and the other of the transport robot 150 and the transfer robot 120 receives the semiconductor wafer W, whereby the transfer of the semiconductor wafer W is performed. The transport robot 150 and the transfer robot 120 constitute a transport mechanism for transporting a semiconductor wafer W from the carriers C to the heat treatment part 160.

As mentioned above, the gate valves 181 and 182 are provided between the indexer part 101 and the first and second cool chambers 131 and 141, respectively. The gate valves 183 and 184 are provided between the transport chamber 170 and the first and second cool chambers 131 and 141, respectively. A gate valve 185 is further provided between the transport chamber 170 and the treatment chamber 6 of the heat treatment part 160. These gate valves 181 to 185 are opened and closed, as appropriate, when the semiconductor wafer W is transported in the heat treatment apparatus 100. Nitrogen gas is supplied from a gas supply part to the transport chamber 170 and the alignment chamber 231, and an exhaust part exhausts atmospheres from the transport chamber 170 and the alignment chamber 231 (both not shown).

Figure 3:
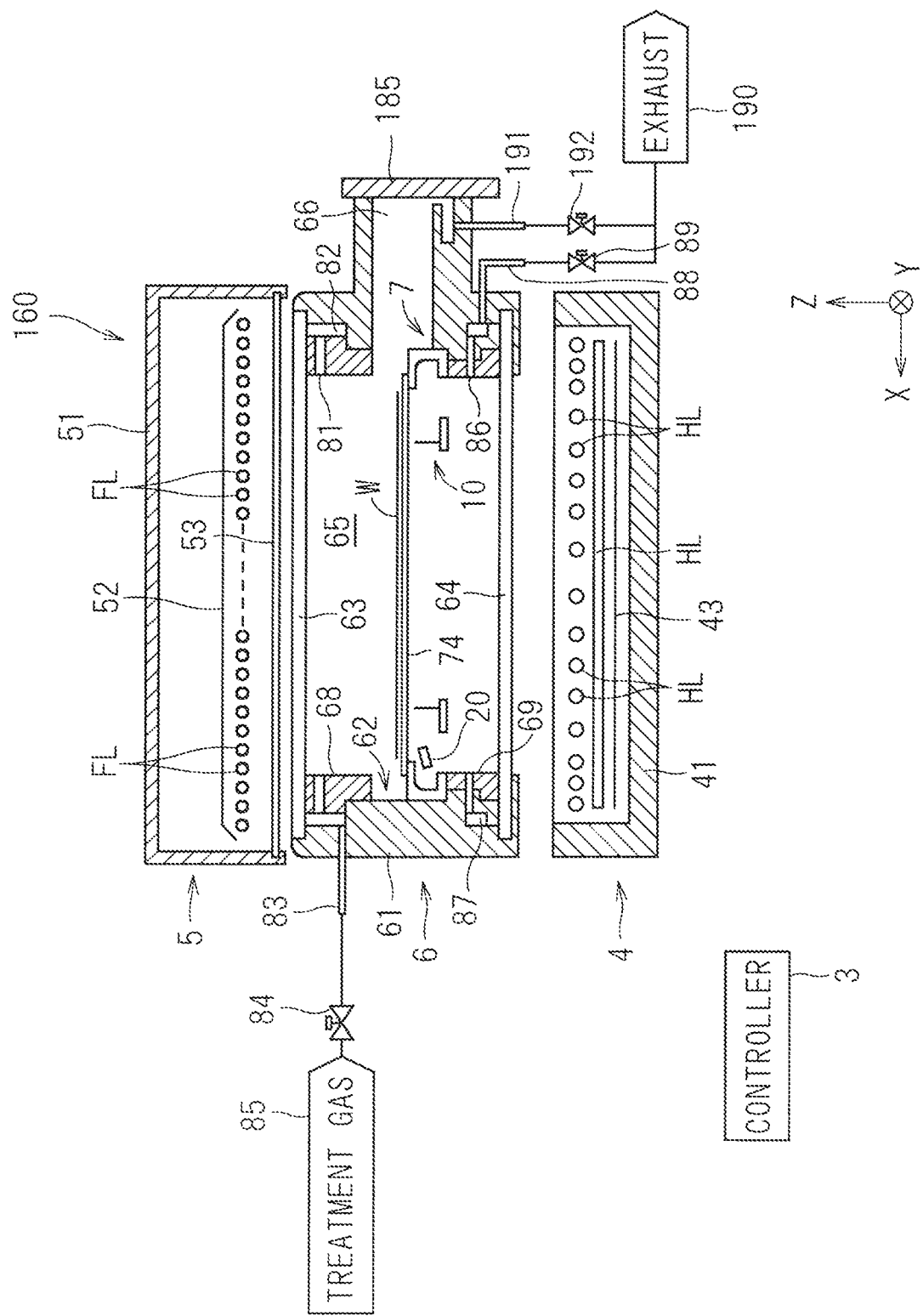
FIG. 3 is a longitudinal sectional view showing a configuration of a heat treatment part.

Next, the configuration of the heat treatment part 160 will be described. FIG. 3 is a longitudinal sectional view showing the configuration of the heat treatment part 160. The heat treatment part 160 includes the treatment chamber 6 for receiving a semiconductor wafer W therein to perform heating treatment on the semiconductor wafer W, a flash lamp house 5 including the plurality of built-in flash lamps FL, and a halogen lamp house 4 including a plurality of built-in halogen lamps HL. The flash lamp house 5 is provided over the treatment chamber 6, and the halogen lamp house 4 is provided under the treatment chamber 6. The heat treatment part 160 further includes a holder 7 provided inside the treatment chamber 6 and for holding a semiconductor wafer W in a horizontal attitude, and a transfer mechanism 10 provided inside the treatment chamber 6 and for transferring a semiconductor wafer W between the holder 7 and the transport robot 150.

The treatment chamber 6 is configured such that upper and lower chamber windows 63 and 64 made of quartz are mounted to the top and bottom, respectively, of a tubular chamber side portion 61. The chamber side portion 61 has a generally tubular shape having an open top and an open bottom. The upper chamber window 63 is mounted to block the top opening of the chamber side portion 61, and the lower chamber window 64 is mounted to block the bottom opening thereof. The upper chamber window 63 forming the ceiling of the treatment chamber 6 is a disk-shaped member made of quartz, and serves as a quartz window that transmits flashes of light emitted from the flash lamps FL therethrough into the treatment chamber 6. The lower chamber window 64 forming the floor of the treatment chamber 6 is also a disk-shaped member made of quartz, and serves as a quartz window that transmits light emitted from the halogen lamps HL therethrough into the treatment chamber 6.

An upper reflective ring 68 is mounted to an upper portion of the inner wall surface of the chamber side portion 61, and a lower reflective ring 69 is mounted to a lower portion thereof. Both of the upper and lower reflective rings 68 and 69 are in the form of an annular ring. The upper reflective ring 68 is mounted by being inserted downwardly from the top of the chamber side portion 61. The lower reflective ring 69, on the other hand, is mounted by being inserted upwardly from the bottom of the chamber side portion 61 and fastened with screws not shown. In other words, the upper and lower reflective rings 68 and 69 are removably mounted to the chamber side portion 61. An interior space of the treatment chamber 6, i.e. a space surrounded by the upper chamber window 63, the lower chamber window 64, the chamber side portion 61, and the upper and lower reflective rings 68 and 69, is defined as a heat treatment space 65.

A recessed portion 62 is defined in the inner wall surface of the treatment chamber 6 by mounting the upper and lower reflective rings 68 and 69 to the chamber side portion 61. Specifically, the recessed portion 62 is defined which is surrounded by a middle portion of the inner wall surface of the chamber side portion 61 where the reflective rings 68 and 69 are not mounted, a lower end surface of the upper reflective ring 68, and an upper end surface of the lower reflective ring 69. The recessed portion 62 is provided in the form of a horizontal annular ring in the inner wall surface of the treatment chamber 6, and surrounds the holder 7 which holds a semiconductor wafer W. The chamber side portion 61 and the upper and lower reflective rings 68 and 69 are made of a metal material (e.g., stainless steel) with high strength and high heat resistance.

The chamber side portion 61 is provided with a transport opening (throat) 66 for the transport of a semiconductor wafer W therethrough into and out of the treatment chamber 6. The transport opening 66 is openable and closable by the gate valve 185. The transport opening 66 is connected in communication with an outer peripheral surface of the recessed portion 62. Thus, when the transport opening 66 is opened by the gate valve 185, a semiconductor wafer W is allowed to be transported through the transport opening 66 and the recessed portion 62 into and out of the heat treatment space 65. When the transport opening 66 is closed by the gate valve 185, the heat treatment space 65 in the treatment chamber 6 is an enclosed space.

At least one gas supply opening 81 for supplying a treatment gas therethrough into the heat treatment space 65 is provided in an upper portion of the inner wall of the treatment chamber 6. The gas supply opening 81 is provided above the recessed portion 62, and may be provided in the upper reflective ring 68. The gas supply opening 81 is connected in communication with a gas supply pipe 83 through a buffer space 82 provided in the form of an annular ring inside the side wall of the treatment chamber 6. The gas supply pipe 83 is connected to a treatment gas supply source 85. A valve 84 is inserted at some midpoint in the gas supply pipe 83. When the valve 84 is opened, the treatment gas is fed from the treatment gas supply source 85 to the buffer space 82. The treatment gas flowing in the buffer space 82 flows in a spreading manner within the buffer space 82 which is lower in fluid resistance than the gas supply opening 81, and is supplied through the gas supply opening 81 into the heat treatment space 65. Examples of the treatment gas usable herein include inert gases such as nitrogen gas ($N_2$), and reactive gases such as hydrogen ($H_2$) and ammonia ($NH_3$) (although nitrogen is used in the present preferred embodiment).

At least one gas exhaust opening 86 for exhausting a gas from the heat treatment space 65 is provided in a lower portion of the inner wall of the treatment chamber 6. The gas exhaust opening 86 is provided below the recessed portion 62, and may be provided in the lower reflective ring 69. The gas exhaust opening 86 is connected in communication with a gas exhaust pipe 88 through a buffer space 87 provided in the form of an annular ring inside the side wall of the treatment chamber 6. The gas exhaust pipe 88 is connected to an exhaust mechanism 190. A valve 89 is inserted at some midpoint in the gas exhaust pipe 88. When the valve 89 is opened, the gas in the heat treatment space 65 is exhausted through the gas exhaust opening 86 and the buffer space 87 to the gas exhaust pipe 88. The at least one gas supply opening 81 and the at least one gas exhaust opening 86 may include a plurality of gas supply openings 81 and a plurality of gas exhaust openings 86, respectively, arranged in a circumferential direction of the treatment chamber 6, and may be in the form of slits. The treatment gas supply source 85 and the exhaust mechanism 190 may be mechanisms provided in the heat treatment apparatus 100 or be utility systems in a factory in which the heat treatment apparatus 100 is installed.

A gas exhaust pipe 191 for exhausting the gas from the heat treatment space 65 is also connected to a distal end of the transport opening 66. The gas exhaust pipe 191 is connected through a valve 192 to the exhaust mechanism 190. By opening the valve 192, the gas in the treatment chamber 6 is exhausted through the transport opening 66.

Figure 4:
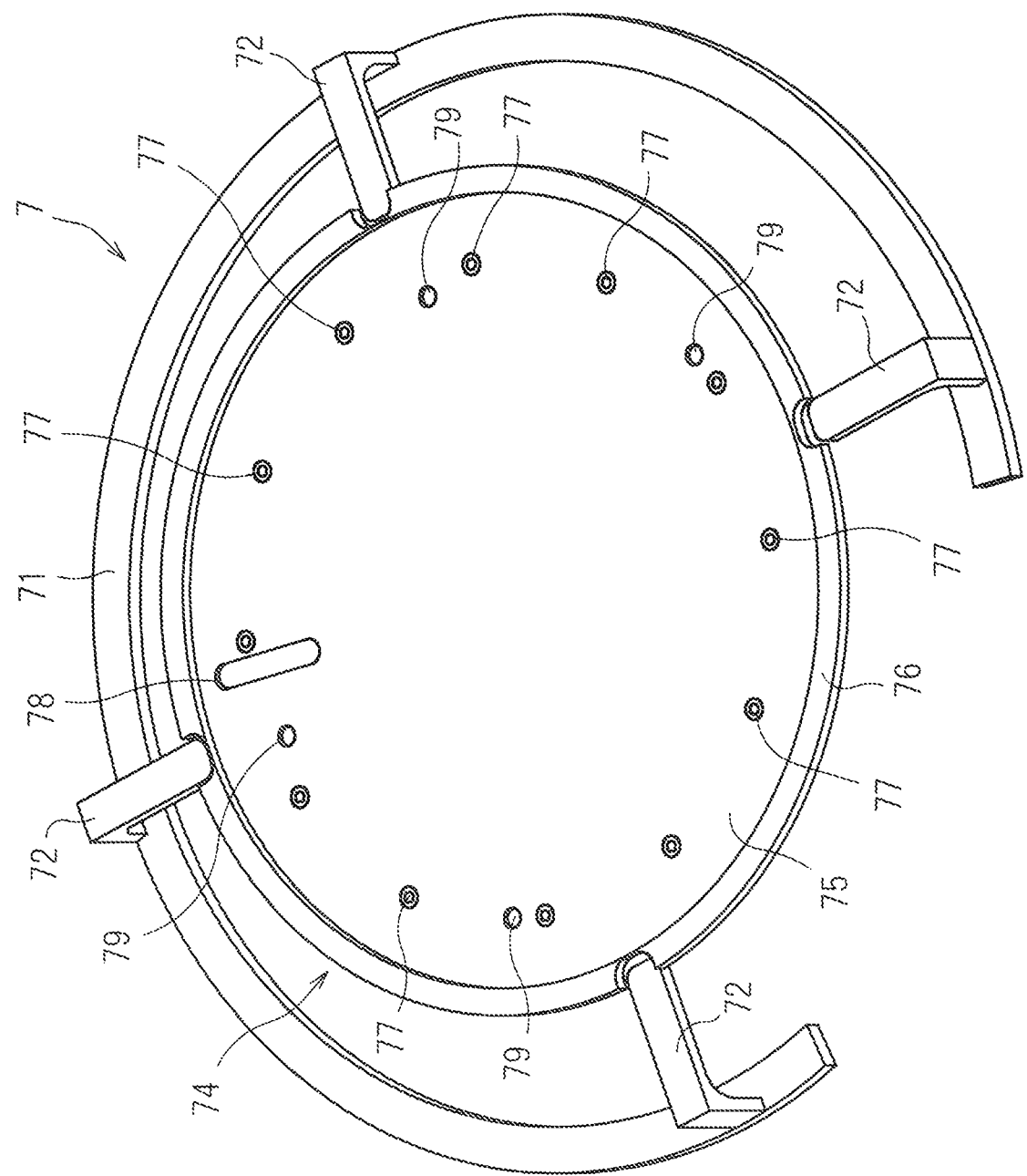
FIG. 4 is a perspective view showing the entire external appearance of a holder.

FIG. 4 is a perspective view showing the entire external appearance of the holder 7. The holder 7 includes a base ring 71, coupling portions 72, and a susceptor 74. The base ring 71, the coupling portions 72, and the susceptor 74 are all made of quartz. In other words, the whole of the holder 7 is made of quartz.

The base ring 71 is a quartz member having an arcuate shape obtained by removing a portion from an annular shape. This removed portion is provided to prevent interference between transfer arms 11 of the transfer mechanism 10 to be described later and the base ring 71. The base ring 71 is supported by the wall surface of the treatment chamber 6 by being placed on the bottom surface of the recessed portion 62 (with reference to FIG. 3). The multiple coupling portions 72 (in the present preferred embodiment, four coupling portions 72) are mounted upright on the upper surface of the base ring 71 and arranged in a circumferential direction of the annular shape thereof. The coupling portions 72 are quartz members, and are rigidly secured to the base ring 71 by welding.

Figure 5:
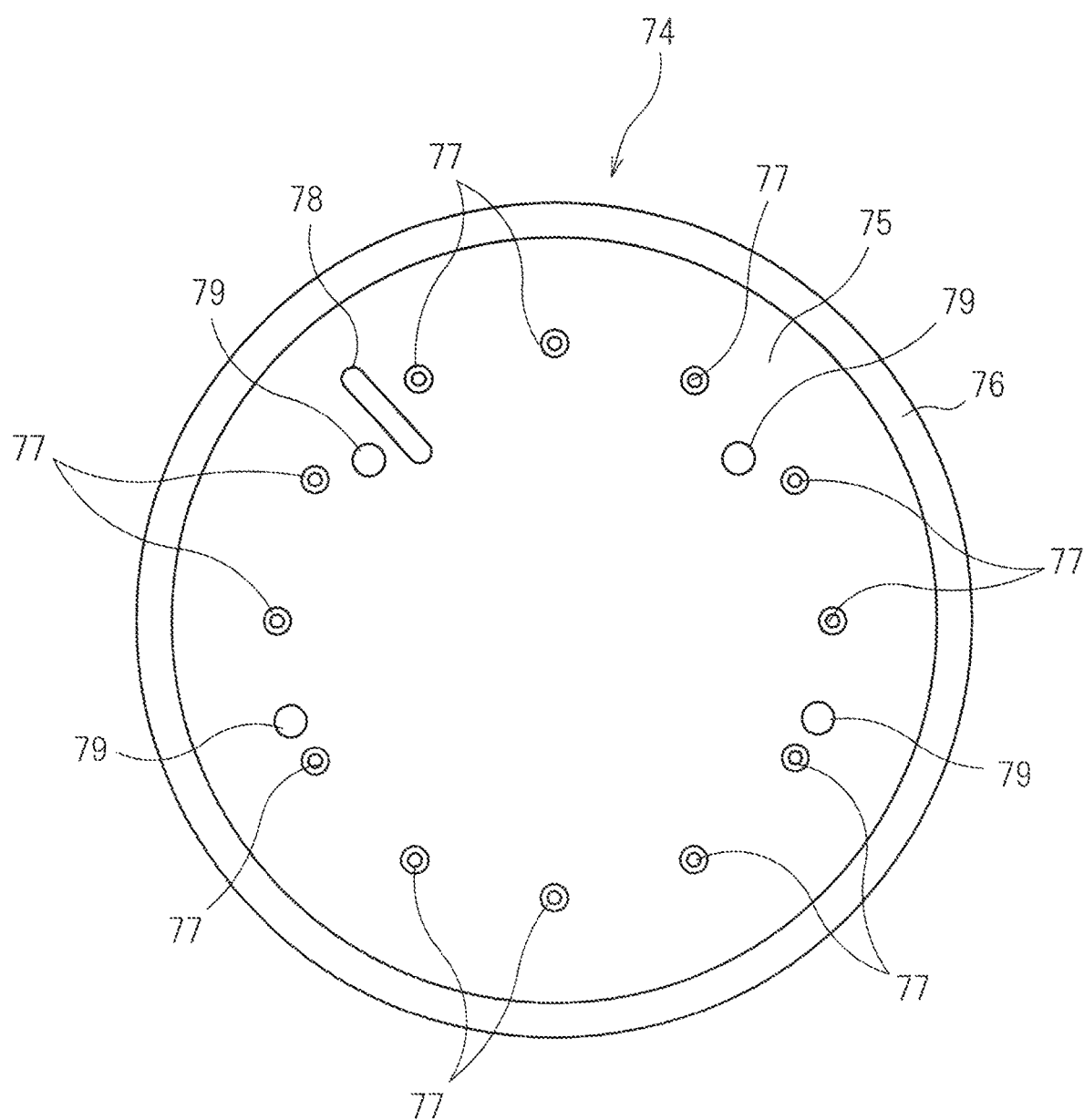
FIG. 5 is a plan view of a susceptor.

The susceptor 74 is supported by the four coupling portions 72 provided on the base ring 71. FIG. 5 is a plan view of the susceptor 74. FIG. 6 is a sectional view of the susceptor 74. The susceptor 74 includes a holding plate 75, a guide ring 76, and a plurality of substrate support pins 77. The holding plate 75 is a generally circular planar member made of quartz. The diameter of the holding plate 75 is greater than that of a semiconductor wafer W. In other words, the holding plate 75 has a size, as seen in plan view, greater than that of the semiconductor wafer W.

The guide ring 76 is provided on a peripheral portion of the upper surface of the holding plate 75. The guide ring 76 is an annular member having an inner diameter greater than the diameter of the semiconductor wafer W. For example, when the diameter of the semiconductor wafer W is 300 mm, the inner diameter of the guide ring 76 is 320 mm. The inner periphery of the guide ring 76 is in the form of a tapered surface which becomes wider in an upward direction from the holding plate 75. The guide ring 76 is made of quartz similar to that of the holding plate 75. The guide ring 76 may be welded to the upper surface of the holding plate 75 or fixed to the holding plate 75 with separately machined pins and the like. Alternatively, the holding plate 75 and the guide ring 76 may be machined as an integral member.

A region of the upper surface of the holding plate 75 which is inside the guide ring 76 serves as a planar holding surface 75a for holding the semiconductor wafer W. The substrate support pins 77 are provided upright on the holding surface 75a of the holding plate 75. In the present preferred embodiment, a total of 12 substrate support pins 77 are spaced at intervals of 30 degrees along the circumference of a circle concentric with the outer circumference of the holding surface 75a (the inner circumference of the guide ring 76). The diameter of the circle on which the 12 substrate support pins 77 are disposed (the distance between opposed ones of the substrate support pins 77) is smaller than the diameter of the semiconductor wafer W, and is 270 to 280 mm (in the present preferred embodiment, 270 mm) when the diameter of the semiconductor wafer W is 300 mm. Each of the substrate support pins 77 is made of quartz. The substrate support pins 77 may be provided by welding on the upper surface of the holding plate 75 or machined integrally with the holding plate 75.

Referring again to FIG. 4, the four coupling portions 72 provided upright on the base ring 71 and the peripheral portion of the holding plate 75 of the susceptor 74 are rigidly secured to each other by welding. In other words, the susceptor 74 and the base ring 71 are fixedly coupled to each other with the coupling portions 72. The base ring 71 of such a holder 7 is supported by the wall surface of the treatment chamber 6, whereby the holder 7 is mounted to the treatment chamber 6. With the holder 7 mounted to the treatment chamber 6, the holding plate 75 of the susceptor 74 assumes a horizontal attitude (an attitude such that the normal to the holding plate 75 coincides with a vertical direction). In other words, the holding surface 75a of the holding plate 75 becomes a horizontal surface.

A semiconductor wafer W transported into the treatment chamber 6 is placed and held in a horizontal attitude on the susceptor 74 of the holder 7 mounted to the treatment chamber 6. At this time, the semiconductor wafer W is supported by the 12 substrate support pins 77 provided upright on the holding plate 75, and is held by the susceptor 74. More strictly speaking, the 12 substrate support pins 77 have respective upper end portions coming in contact with the lower surface of the semiconductor wafer W to support the semiconductor wafer W. The semiconductor wafer W is supported in a horizontal attitude by the 12 substrate support pins 77 because the 12 substrate support pins 77 have a uniform height (distance from the upper ends of the substrate support pins 77 to the holding surface 75a of the holding plate 75).

The semiconductor wafer W supported by the substrate support pins 77 is spaced a predetermined distance apart from the holding surface 75a of the holding plate 75. The thickness of the guide ring 76 is greater than the height of the substrate support pins 77. Thus, the guide ring 76 prevents the horizontal misregistration of the semiconductor wafer W supported by the substrate support pins 77.

As shown in FIGS. 4 and 5, an opening 78 is provided in the holding plate 75 of the susceptor 74 so as to extend vertically through the holding plate 75 of the susceptor 74. The opening 78 is provided for a radiation thermometer 20 (with reference to FIG. 3) to receive radiation (infrared radiation) emitted from the lower surface of the semiconductor wafer W held by the susceptor 74. Specifically, the radiation thermometer 20 receives the radiation emitted from the lower surface of the semiconductor wafer W held by the susceptor 74 through the opening 78 to measure the temperature of the semiconductor wafer W. Further, the holding plate 75 of the susceptor 74 further includes four through holes 79 bored therein and designed so that lift pins 12 of the transfer mechanism 10 to be described later pass through the through holes 79, respectively, to transfer a semiconductor wafer W.

Figure 7:
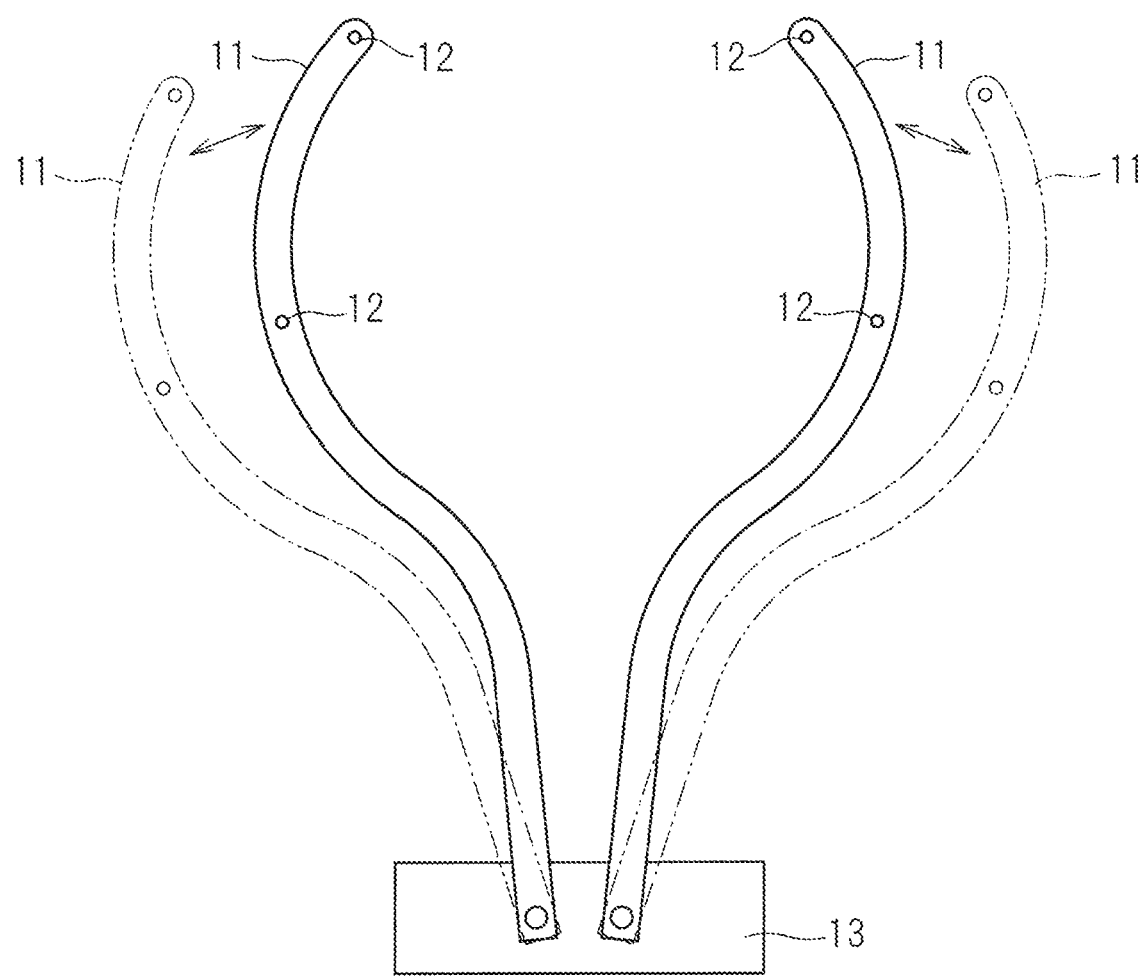
FIG. 7 is a plan view of a transfer mechanism.

FIG. 7 is a plan view of the transfer mechanism 10. FIG. 8 is a side view of the transfer mechanism 10. The transfer mechanism 10 includes the two transfer arms 11. The transfer arms 11 are of an arcuate configuration extending substantially along the annular recessed portion 62. Each of the transfer arms 11 includes the two lift pins 12 mounted upright thereon. The transfer arms 11 are pivotable by a horizontal movement mechanism 13. The horizontal movement mechanism 13 moves the pair of transfer arms 11 horizontally between a transfer operation position (a position indicated by solid lines in FIG. 7) in which a semiconductor wafer W is transferred to and from the holder 7 and a retracted position (a position indicated by dash-double-dot lines in FIG. 7) in which the transfer arms 11 do not overlap the semiconductor wafer W held by the holder 7 as seen in plan view. The transfer operation position is under the susceptor 74, and the retracted position is outside the susceptor 74. The horizontal movement mechanism 13 may be of the type which causes individual motors to pivot the transfer arms 11 respectively or of the type which uses a linkage mechanism to cause a single motor to pivot the pair of transfer arms 11 in cooperative relation.

The transfer arms 11 are moved upwardly and downwardly together with the horizontal movement mechanism 13 by an elevating mechanism 14. As the elevating mechanism 14 moves up the pair of transfer arms 11 in their transfer operation position, the four lift pins 12 in total pass through the respective four through holes 79 (with reference to FIGS. 4 and 5) bored in the susceptor 74, so that the upper ends of the lift pins 12 protrude from the upper surface of the susceptor 74. On the other hand, as the elevating mechanism 14 moves down the pair of transfer arms 11 in their transfer operation position to take the lift pins 12 out of the respective through holes 79 and the horizontal movement mechanism 13 moves the pair of transfer arms 11 so as to open the transfer arms 11, the transfer arms 11 move to their retracted position. The retracted position of the pair of transfer arms 11 is immediately over the base ring 71 of the holder 7. The retracted position of the transfer arms 11 is inside the recessed portion 62 because the base ring 71 is placed on the bottom surface of the recessed portion 62. An exhaust mechanism not shown is also provided near the location where the drivers (the horizontal movement mechanism 13 and the elevating mechanism 14) of the transfer mechanism 10 are provided, and is configured to exhaust an atmosphere around the drivers of the transfer mechanism 10 to the outside of the treatment chamber 6.

Referring again to FIG. 3, the flash lamp house 5 provided over the treatment chamber 6 includes an enclosure 51, a light source provided inside the enclosure 51 and including the multiple (in the present preferred embodiment, 30) xenon flash lamps FL, and a reflector 52 provided inside the enclosure 51 so as to cover the light source from above. The flash lamp house 5 further includes a lamp light radiation window 53 mounted to the bottom of the enclosure 51 of the flash lamp house 5. The lamp light radiation window 53 forming the floor of the flash lamp house 5 is a plate-like quartz window made of quartz. The flash lamp house 5 is provided over the treatment chamber 6, whereby the lamp light radiation window 53 is opposed to the upper chamber window 63. The flash lamps FL direct flashes of light from over the treatment chamber 6 through the lamp light radiation window 53 and the upper chamber window 63 toward the heat treatment space 65.

The flash lamps FL, each of which is a rod-shaped lamp having an elongated cylindrical shape, are arranged in a plane so that the longitudinal directions of the respective flash lamps FL are in parallel with each other along a main surface of a semiconductor wafer W held by the holder 7 (that is, in a horizontal direction). Thus, a plane defined by the arrangement of the flash lamps FL is also a horizontal plane.

Each of the xenon flash lamps FL includes a rod-shaped glass tube (discharge tube) containing xenon gas sealed therein and having positive and negative electrodes provided on opposite ends thereof and connected to a capacitor, and a trigger electrode attached to the outer peripheral surface of the glass tube. Because the xenon gas is electrically insulative, no current flows in the glass tube in a normal state even if electrical charge is stored in the capacitor. However, if a high voltage is applied to the trigger electrode to produce an electrical breakdown, electricity stored in the capacitor flows momentarily in the glass tube, and xenon atoms or molecules are excited at this time to cause light emission. Such a xenon flash lamp FL has the property of being capable of emitting extremely intense light as compared with a light source that stays lit continuously such as a halogen lamp HL because the electrostatic energy previously stored in the capacitor is converted into an ultrashort light pulse ranging from 0.1 to 100 milliseconds. Thus, the flash lamps FL are pulsed light emitting lamps which emit light instantaneously for an extremely short time period of less than one second. The light emission time of the flash lamps FL is adjustable by the coil constant of a lamp light source which supplies power to the flash lamps FL.

The reflector 52 is provided over the plurality of flash lamps FL so as to cover all of the flash lamps FL. A fundamental function of the reflector 52 is to reflect flashes of light emitted from the plurality of flash lamps FL toward the heat treatment space 65. The reflector 52 is a plate made of an aluminum alloy. A surface of the reflector 52 (a surface which faces the flash lamps FL) is roughened by abrasive blasting.

The halogen lamp house 4 provided under the treatment chamber 6 includes an enclosure 41 incorporating the multiple (in the present preferred embodiment, 40) halogen lamps HL. The halogen lamps HL direct light from under the treatment chamber 6 through the lower chamber window 64 toward the heat treatment space 65.

Figure 9:
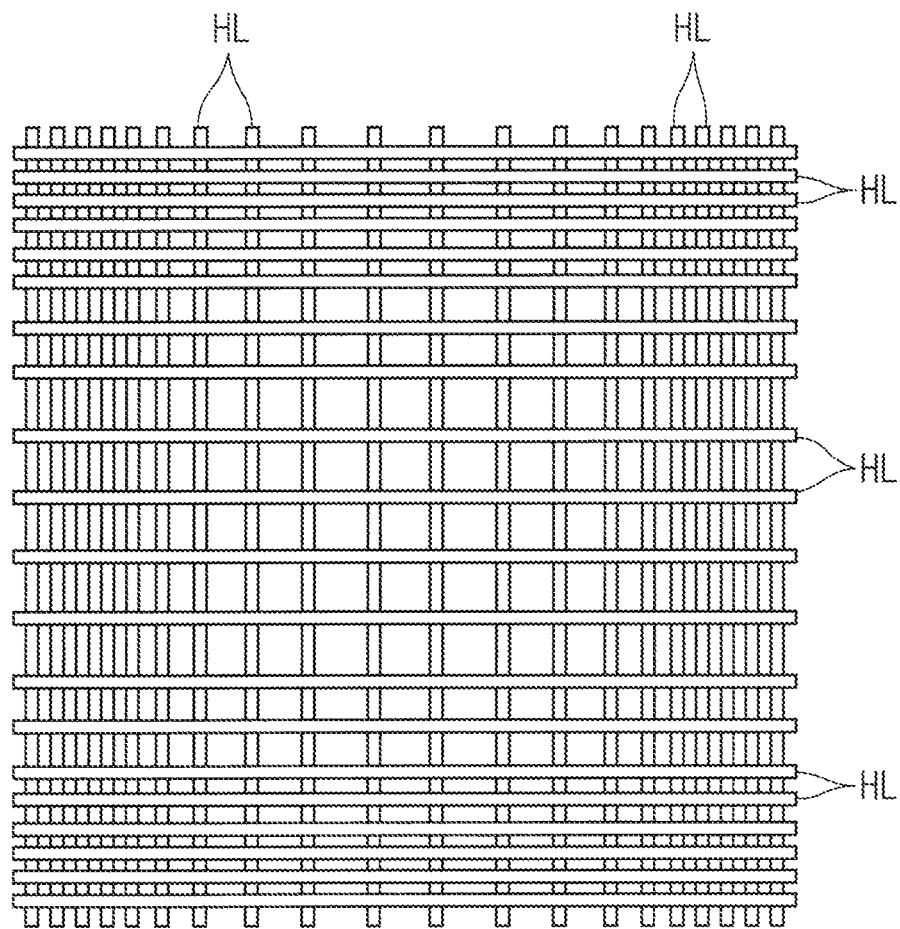
FIG. 9 is a plan view showing an arrangement of halogen lamps.

FIG. 9 is a plan view showing an arrangement of the multiple halogen lamps HL. In the present preferred embodiment, 20 halogen lamps HL are arranged in each of two tiers, i.e. upper and lower tiers. Each of the halogen lamps HL is a rod-shaped lamp having an elongated cylindrical shape. The 20 halogen lamps HL in each of the upper and lower tiers are arranged so that the longitudinal directions thereof are in parallel with each other along a main surface of a semiconductor wafer W held by the holder 7 (that is, in a horizontal direction). Thus, a plane defined by the arrangement of the halogen lamps HL in each of the upper and lower tiers is also a horizontal plane.

As shown in FIG. 9, the halogen lamps HL in each of the upper and lower tiers are disposed at a higher density in a region opposed to the peripheral portion of the semiconductor wafer W held by the holder 7 than in a region opposed to the central portion thereof. In other words, the halogen lamps HL in each of the upper and lower tiers are arranged at shorter intervals in the peripheral portion of the lamp arrangement than in the central portion thereof. This allows a greater amount of light to impinge upon the peripheral portion of the semiconductor wafer W where a temperature decrease is prone to occur when the semiconductor wafer W is heated by the irradiation thereof with light from the halogen lamps HL.

The group of halogen lamps HL in the upper tier and the group of halogen lamps HL in the lower tier are arranged to intersect each other in a lattice pattern. In other words, the 40 halogen lamps HL in total are disposed so that the longitudinal direction of each of the halogen lamps HL arranged in the upper tier and the longitudinal direction of each of the halogen lamps HL arranged in the lower tier are orthogonal to each other.

Each of the halogen lamps HL is a filament-type light source which passes current through a filament disposed in a glass tube to make the filament incandescent, thereby emitting light. A gas prepared by introducing a halogen element (iodine, bromine and the like) in trace amounts into an inert gas such as nitrogen, argon and the like is sealed in the glass tube. The introduction of the halogen element allows the temperature of the filament to be set at a high temperature while suppressing a break in the filament. Thus, the halogen lamps HL have the properties of having a longer life than typical incandescent lamps and being capable of continuously emitting intense light. That is, the halogen lamps HL are continuous lighting lamps that emit light continuously for not less than one second. In addition, the halogen lamps HL, which are rod-shaped lamps, have a long life. The arrangement of the halogen lamps HL in a horizontal direction provides good efficiency of radiation toward the semiconductor wafer W provided over the halogen lamps HL.

A reflector 43 is provided also inside the enclosure 41 of the halogen lamp house 4 under the halogen lamps HL arranged in two tiers (FIG. 3). The reflector 43 reflects the light emitted from the halogen lamps HL toward the heat treatment space 65.

The heat treatment part 160 further includes, in addition to the aforementioned components, various cooling structures to prevent an excessive temperature rise in the halogen lamp house 4, the flash lamp house 5, and the treatment chamber 6 because of the heat energy generated from the halogen lamps HL and the flash lamps FL during the heat treatment of a semiconductor wafer W. As an example, a water cooling tube (not shown) is provided in the walls of the treatment chamber 6. Also, the halogen lamp house 4 and the flash lamp house 5 have an air cooling structure for forming a gas flow therein to exhaust heat. Air is supplied to a gap between the upper chamber window 63 and the lamp light radiation window 53 to cool down the flash lamp house 5 and the upper chamber window 63.

Figure 10:
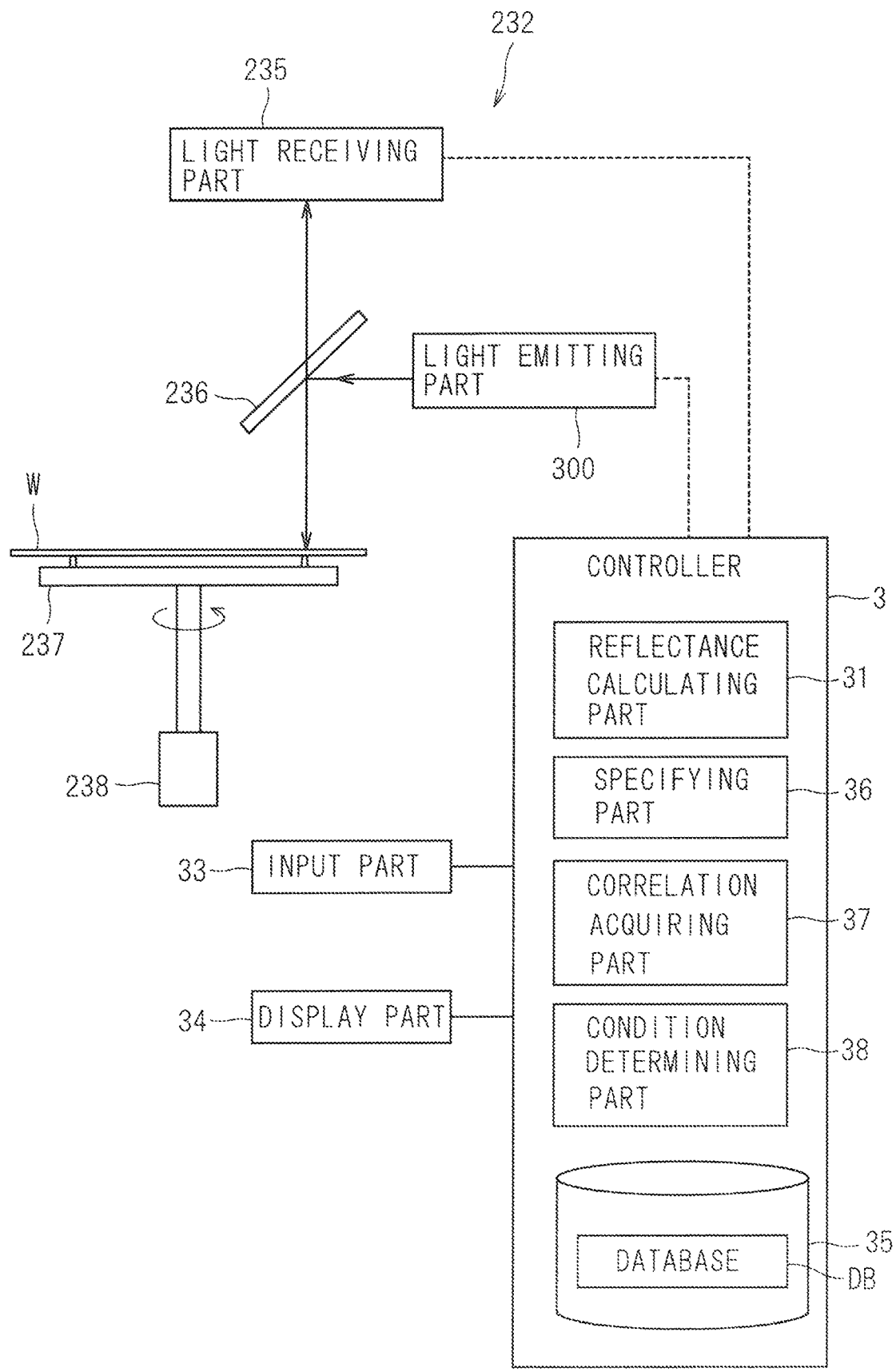
FIG. 10 is a diagram showing a configuration of a reflectance measuring part and a controller.

FIG. 10 is a diagram showing a configuration of the reflectance measuring part 232 provided in the alignment part 230 and the controller 3. The reflectance measuring part 232 includes a light emitting part 300, a light receiving part 235, and a half mirror 236. The rotary support part 237 for supporting and rotating a semiconductor wafer W and the rotary motor 238 for rotatably driving the rotary support part 237 are provided in the alignment chamber 231 of the alignment part 230. The rotary motor 238 rotates the rotary support part 237 supporting the semiconductor wafer W, whereby the orientation of the semiconductor wafer W is adjusted.

The light emitting part 300 includes a light source such as a xenon light source, a halogen light source or an LED light source, and emits light for reflectance measurement. The light receiving part 235 includes a light receiving element for converting the intensity of received light into an electric signal. Light emitted from the light emitting part 300 is reflected by the half mirror 236, and is applied perpendicularly to the upper surface of the semiconductor wafer W supported by the rotary support part 237. The applied light from the light emitting part 300 is reflected from the upper surface of the semiconductor wafer W. The reflected light is transmitted through the half mirror 236, and is received by the light receiving part 235. The controller 3 calculates the reflectance of the upper surface of the semiconductor wafer W, based on the intensity of the reflected light received by the light receiving part 235. Preferably, the light emitting part 300 includes a plurality of light sources different in wavelength range of light to be applied. The provision of a plurality of light sources different in wavelength range in the light emitting part 300 allows the measurement of the reflectance of the semiconductor wafer W over a wide wavelength range. Also, the light emitting part 300 may be configured to apply light to a plurality of locations on the upper surface of the semiconductor wafer W. The application of light to a plurality of locations on the upper surface of the semiconductor wafer W allows a reduction in local pattern dependence.

The controller 3 controls the aforementioned various operating mechanisms provided in the heat treatment apparatus 100. The controller 3 is similar in hardware configuration to a typical computer. Specifically, the controller 3 includes a CPU that is a circuit for performing various computation processes, a ROM or read-only memory for storing a basic program therein, a RAM or readable/writable memory for storing various pieces of information therein, and a magnetic disk 35 for storing control software, data and the like thereon. The CPU in the controller 3 executes a predetermined processing program, whereby the processes in the heat treatment apparatus 100 proceed. A reflectance calculating part 31, a specifying part 36, a correlation acquiring part 37, and a condition determining part 38 are functional processing parts implemented by the CPU of the controller 3 executing a predetermined processing program. The details on the processing in the reflectance calculating part 31, the specifying part 36, the correlation acquiring part 37, and the condition determining part 38 will be further described later. The controller 3 is shown in the indexer part 101 in FIG. 1. The present invention, however, is not limited to this. The controller 3 may be disposed in any position in the heat treatment apparatus 100.

The controller 3 is connected to a display part 34 and an input part 33. The controller 3 causes a variety of pieces of information to appear on the display part 34. An operator of the heat treatment apparatus 100 may input various commands and parameters from the input part 33 while viewing the information appearing on the display part 34. A keyboard and a mouse, for example, may be used as the input part 33. A liquid crystal display, for example, may be used as the display part 34. In the present preferred embodiment, a liquid crystal touch panel provided on an outer wall of the heat treatment apparatus 100 is used to function as both the display part 34 and the input part 33.

Next, a treatment operation in the heat treatment apparatus 100 according to the present invention will be described. A typical treatment operation for an ordinary semiconductor wafer (product wafer) W that becomes a product will be described herein. A semiconductor wafer W to be treated herein is a semiconductor substrate doped with impurities (ions) by an ion implantation process. The impurities are activated by the heat treatment apparatus 100 performing the process of heating (annealing) the semiconductor wafer W by means of flash irradiation.

First, while being stored in a carrier C, untreated semiconductor wafers W implanted with impurities are placed on the load port 110 of the indexer part 101. The transfer robot 120 takes the untreated semiconductor wafers W one by one out of the carrier C to transport each of the untreated semiconductor wafers W into the alignment chamber 231 of the alignment part 230. In the alignment chamber 231, a semiconductor wafer W supported by the rotary support part 237 is rotated in a horizontal plane about a vertical axis passing through the central portion of the semiconductor wafer W, and a notch or the like is optically detected, whereby the orientation of the semiconductor wafer W is adjusted.

Next, the transfer robot 120 of the indexer part 101 takes the orientation-adjusted semiconductor wafer W out of the alignment chamber 231 to transport the semiconductor wafer W into the first cool chamber 131 of the cooling part 130 or the second cool chamber 141 of the cooling part 140. The untreated semiconductor wafer W transported into the first cool chamber 131 or the second cool chamber 141 is transported to the transport chamber 170 by the transport robot 150. The first cool chamber 131 and the second cool chamber 141 function as the paths for transferring the semiconductor wafer W when the untreated semiconductor wafer W is transferred from the indexer part 101 via the first cool chamber 131 or the second cool chamber 141 to the transport chamber 170.

After taking out the semiconductor wafer W, the transport robot 150 pivots so as to face toward the heat treatment part 160. Subsequently, the gate valve 185 opens the space between the treatment chamber 6 and the transport chamber 170, and the transport robot 150 transports the untreated semiconductor wafer W into the treatment chamber 6. At this time, if a preceding semiconductor wafer W subjected to the heating treatment is present in the treatment chamber 6, the untreated semiconductor wafer W is transported into the treatment chamber 6 after one of the transport hands 151a and 151b takes out the semiconductor wafer W subjected to the heating treatment. In this manner, the semiconductor wafers W are interchanged. Thereafter, the gate valve 185 closes the space between the treatment chamber 6 and the transport chamber 170.

The semiconductor wafer W transported into the treatment chamber 6 is preheated by the halogen lamps HL, and is thereafter subjected to the flash heating treatment by flash irradiation from the flash lamps FL. This flash heating treatment activates the impurities implanted in the semiconductor wafer W.

After the completion of the flash heating treatment, the gate valve 185 opens the space between the treatment chamber 6 and the transport chamber 170 again, and the transport robot 150 transports the semiconductor wafer W subjected to the flash heating treatment from the treatment chamber 6 to the transport chamber 170. After taking out the semiconductor wafer W, the transport robot 150 pivots from the treatment chamber 6 so as to face toward the first cool chamber 131 or the second cool chamber 141. The gate valve 185 closes the space between the treatment chamber 6 and the transport chamber 170.

Thereafter, the transport robot 150 transports the semiconductor wafer W subjected to the heating treatment into the first cool chamber 131 of the cooling part 130 or the second cool chamber 141 of the cooling part 140. At this time, the semiconductor wafer W that has passed through the first cool chamber 131 before the heating treatment is also transported into the first cool chamber 131 after the heating treatment, and the semiconductor wafer W that has passed through the second cool chamber 141 before the heating treatment is also transported into the second cool chamber 141 after the heating treatment. In the first cool chamber 131 or the second cool chamber 141, the semiconductor wafer W subjected to the flash heating treatment is cooled. The semiconductor wafer W is cooled to near ordinary temperatures in the first cool chamber 131 or the second cool chamber 141 because the temperature of the entire semiconductor wafer W is relatively high when the semiconductor wafer W is transported out of the treatment chamber 6 of the heat treatment part 160.

After a lapse of a predetermined cooling time period, the transfer robot 120 transports the cooled semiconductor wafer W out of the first cool chamber 131 or the second cool chamber 141, and returns the cooled semiconductor wafer W back to the carrier C. After a predetermined number of treated semiconductor wafers W are stored in the carrier C, the carrier C is transported from the load port 110 of the indexer part 101 to the outside.

The description on the heating treatment in the heat treatment part 160 will be continued. Prior to the transport of the semiconductor wafer W into the treatment chamber 6, the valve 84 is opened for supply of gas, and the valves 89 and 192 for exhaust of gas are opened, so that the supply and exhaust of gas into and out of the treatment chamber 6 start. When the valve 84 is opened, nitrogen gas is supplied through the gas supply opening 81 into the heat treatment space 65. When the valve 89 is opened, the gas within the treatment chamber 6 is exhausted through the gas exhaust opening 86. This causes the nitrogen gas supplied from an upper portion of the heat treatment space 65 in the treatment chamber 6 to flow downwardly and then to be exhausted from a lower portion of the heat treatment space 65.

The gas within the treatment chamber 6 is exhausted also through the transport opening 66 by opening the valve 192. Further, the exhaust mechanism not shown exhausts an atmosphere near the drivers of the transfer mechanism 10. It should be noted that the nitrogen gas is continuously supplied into the heat treatment space 65 during the heat treatment of a semiconductor wafer W in the heat treatment part 160. The amount of nitrogen gas supplied into the heat treatment space 65 is changed as appropriate in accordance with process steps.

Subsequently, the gate valve 185 is opened to open the transport opening 66. The transport robot 150 transports a semiconductor wafer W to be treated through the transport opening 66 into the heat treatment space 65 of the treatment chamber 6. The transport robot 150 moves the transport hand 151a (or the transport hand 151b) holding the untreated semiconductor wafer W forward to a position lying immediately over the holder 7, and stops the transport hand 151a (or the transport hand 151b) thereat. Then, the pair of transfer arms 11 of the transfer mechanism 10 is moved horizontally from the retracted position to the transfer operation position and is then moved upwardly, whereby the lift pins 12 pass through the through holes 79 and protrude from the upper surface of the holding plate 75 of the susceptor 74 to receive the semiconductor wafer W. At this time, the lift pins 12 move upwardly to above the upper ends of the substrate support pins 77.

After the untreated semiconductor wafer W is placed on the lift pins 12, the transport robot 150 causes the transport hand 151a to move out of the heat treatment space 65, and the gate valve 185 closes the transport opening 66. Then, the pair of transfer arms 11 moves downwardly to transfer the semiconductor wafer W from the transfer mechanism 10 to the susceptor 74 of the holder 7, so that the semiconductor wafer W is held in a horizontal attitude from below. The semiconductor wafer W is supported by the substrate support pins 77 provided upright on the holding plate 75, and is held by the susceptor 74. The semiconductor wafer W is held by the holder 7 in such an attitude that the front surface thereof patterned and implanted with impurities is the upper surface. A predetermined distance is defined between the back surface (a main surface opposite from the front surface) of the semiconductor wafer W supported by the substrate support pins 77 and the holding surface 75a of the holding plate 75. The pair of transfer arms 11 moved downwardly below the susceptor 74 is moved back to the retracted position, i.e. to the inside of the recessed portion 62, by the horizontal movement mechanism 13.

After the semiconductor wafer W is held from below in a horizontal attitude by the susceptor 74 of the holder 7, the 40 halogen lamps HL turn on simultaneously to start preheating (or assist-heating). Halogen light emitted from the halogen lamps HL is transmitted through the lower chamber window 64 and the susceptor 74 both made of quartz, and impinges upon the lower surface of the semiconductor wafer W. By receiving light irradiation from the halogen lamps HL, the semiconductor wafer W is preheated, so that the temperature of the semiconductor wafer W increases. It should be noted that the transfer arms 11 of the transfer mechanism 10, which are retracted to the inside of the recessed portion 62, do not become an obstacle to the heating using the halogen lamps HL.

The temperature of the semiconductor wafer W is measured with the radiation thermometer 20 when the halogen lamps HL perform the preheating. Specifically, the radiation thermometer 20 receives infrared radiation emitted from the lower surface of the semiconductor wafer W held by the susceptor 74 through the opening 78 to measure the temperature of the semiconductor wafer W which is on the increase. The measured temperature of the semiconductor wafer W is transmitted to the controller 3. The controller 3 controls the output from the halogen lamps HL while monitoring whether the temperature of the semiconductor wafer W which is on the increase by the irradiation with light from the halogen lamps HL reaches a predetermined preheating temperature T1 or not. In other words, the controller 3 effects feedback control of the output from the halogen lamps HL so that the temperature of the semiconductor wafer W is equal to the preheating temperature T1, based on the value measured with the radiation thermometer 20. The preheating temperature T1 shall be on the order of 600° to 800° C. (in the present preferred embodiment, 700° C.) at which there is no apprehension that the impurities implanted in the semiconductor wafer W are diffused by heat.

After the temperature of the semiconductor wafer W reaches the preheating temperature T1, the controller 3 maintains the temperature of the semiconductor wafer W at the preheating temperature T1 for a short time. Specifically, at the point in time when the temperature of the semiconductor wafer W measured with the radiation thermometer 20 reaches the preheating temperature T1, the controller 3 adjusts the output from the halogen lamps HL to maintain the temperature of the semiconductor wafer W at approximately the preheating temperature T1.

By performing such preheating using the halogen lamps HL, the temperature of the entire semiconductor wafer W is uniformly increased to the preheating temperature T1. In the stage of preheating using the halogen lamps HL, the semiconductor wafer W shows a tendency to be lower in temperature in a peripheral portion thereof where heat dissipation is liable to occur than in a central portion thereof. However, the halogen lamps HL in the halogen lamp house 4 are disposed at a higher density in the region opposed to the peripheral portion of the semiconductor wafer W than in the region opposed to the central portion thereof. This causes a greater amount of light to impinge upon the peripheral portion of the semiconductor wafer W where heat dissipation is liable to occur, thereby providing a uniform in-plane temperature distribution of the semiconductor wafer W in the stage of preheating.

The flash lamps FL irradiate the front surface of the semiconductor wafer W with a flash of light at the point in time when a predetermined time period has elapsed since the temperature of the semiconductor wafer W reached the preheating temperature T1. At this time, part of the flash of light emitted from the flash lamps FL travels directly toward the interior of the treatment chamber 6. The remainder of the flash of light is reflected once from the reflector 52, and then travels toward the interior of the treatment chamber 6. The irradiation of the semiconductor wafer W with such flashes of light achieves the flash heating of the semiconductor wafer W.

The flash heating, which is achieved by the emission of a flash of light from the flash lamps FL, is capable of increasing the front surface temperature of the semiconductor wafer W in a short time. Specifically, the flash of light emitted from the flash lamps FL is an intense flash of light emitted for an extremely short period of time ranging from about 0.1 to about 100 milliseconds as a result of the conversion of the electrostatic energy previously stored in the capacitor into such an ultrashort light pulse. The front surface temperature of the semiconductor wafer W subjected to the flash heating by the flash irradiation from the flash lamps FL momentarily increases to a treatment temperature T2 of 1000° C. or higher. After the impurities implanted in the semiconductor wafer W are activated, the front surface temperature of the semiconductor wafer W decreases rapidly. Because of the capability of increasing and decreasing the front surface temperature of the semiconductor wafer W in an extremely short time, the flash heating achieves the activation of the impurities implanted in the semiconductor wafer W while suppressing the diffusion of the impurities due to heat. It should be noted that the time required for the activation of the impurities is extremely short as compared with the time required for the thermal diffusion of the impurities. Thus, the activation is completed in a short time ranging from about 0.1 to about 100 milliseconds during which no diffusion occurs.

After a predetermined time period has elapsed since the completion of the flash heating treatment, the halogen lamps HL turn off. This causes the temperature of the semiconductor wafer W to decrease rapidly from the preheating temperature T1. The radiation thermometer 20 measures the temperature of the semiconductor wafer W which is on the decrease. The result of measurement is transmitted to the controller 3. The controller 3 monitors whether the temperature of the semiconductor wafer W is decreased to a predetermined temperature or not, based on the result of measurement with the radiation thermometer 20. After the temperature of the semiconductor wafer W is decreased to the predetermined temperature or below, the pair of transfer arms 11 of the transfer mechanism 10 is moved horizontally again from the retracted position to the transfer operation position and is then moved upwardly, so that the lift pins 12 protrude from the upper surface of the susceptor 74 to receive the heat-treated semiconductor wafer W from the susceptor 74. Subsequently, the transport opening 66 which has been closed is opened by the gate valve 185, and the transport hand 151b (or the transport hand 151a) of the transport robot 150 transports the treated semiconductor wafer W placed on the lift pins 12 to the outside. The transport robot 150 moves the transport hand 151b forward to a position lying immediately under the semiconductor wafer W thrust upwardly by the lift pins 12, and stops the transport hand 151b thereat. Then, the pair of transfer arms 11 of the transfer mechanism 10 moves downwardly, whereby the semiconductor wafer W subjected to the flash heating is transferred to and placed on the transport hand 151b. Thereafter, the transport robot 150 causes the transport hand 151b to move out of the treatment chamber 6, thereby transporting the treated semiconductor wafer W to the outside.

Next, a technique for specifying the type and thickness of a thin film formed on the front surface of a semiconductor wafer W will be described. Typically, there are many cases in which a thin film is formed on the front surface of a semiconductor wafer W which becomes a product. The front surface of the aforementioned semiconductor wafer W to be treated is also covered with a thin film formed thereon, and is implanted with impurities. It is necessary to set optimum treatment conditions in accordance with the type and thickness of the thin film formed on the semiconductor wafer W because the reflectance of the semiconductor wafer W differs depending on the type and thickness of the thin film.

Figure 11:
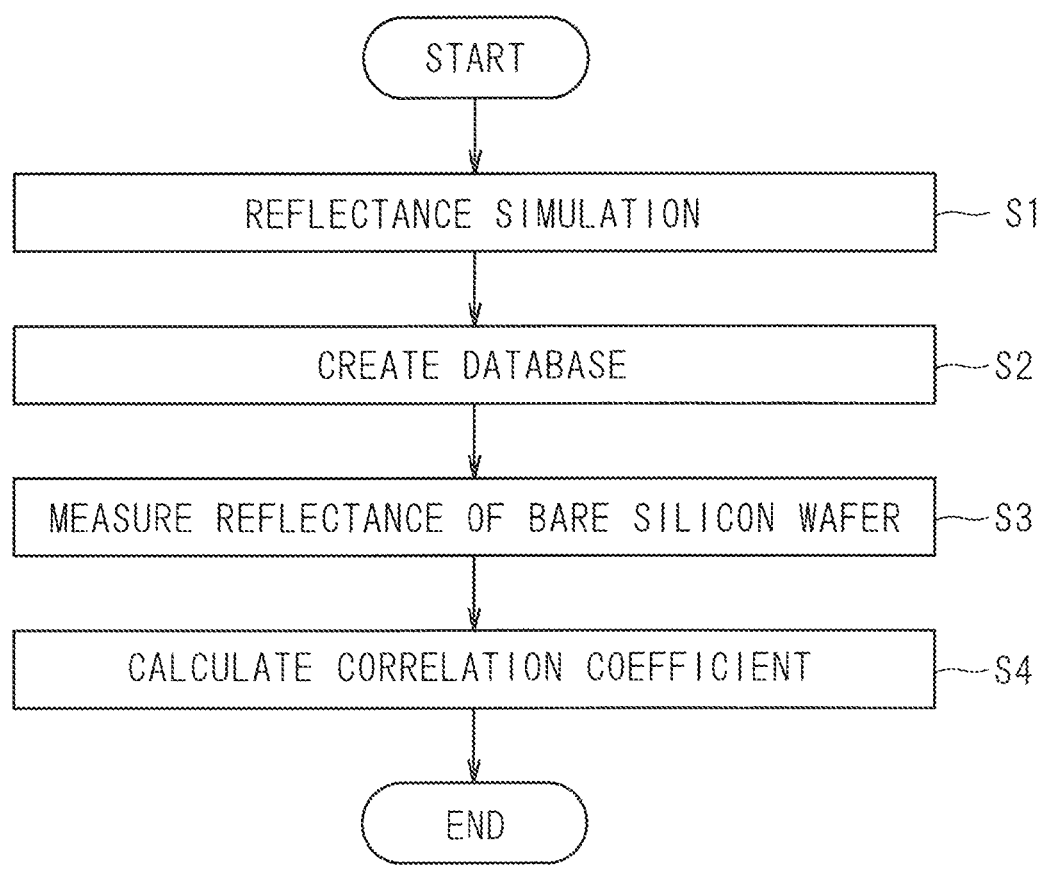
FIGS. 11 and 12 are flow diagrams showing procedures for specifying the type and thickness of a thin film formed on a front surface of a semiconductor wafer.
Figure 12:
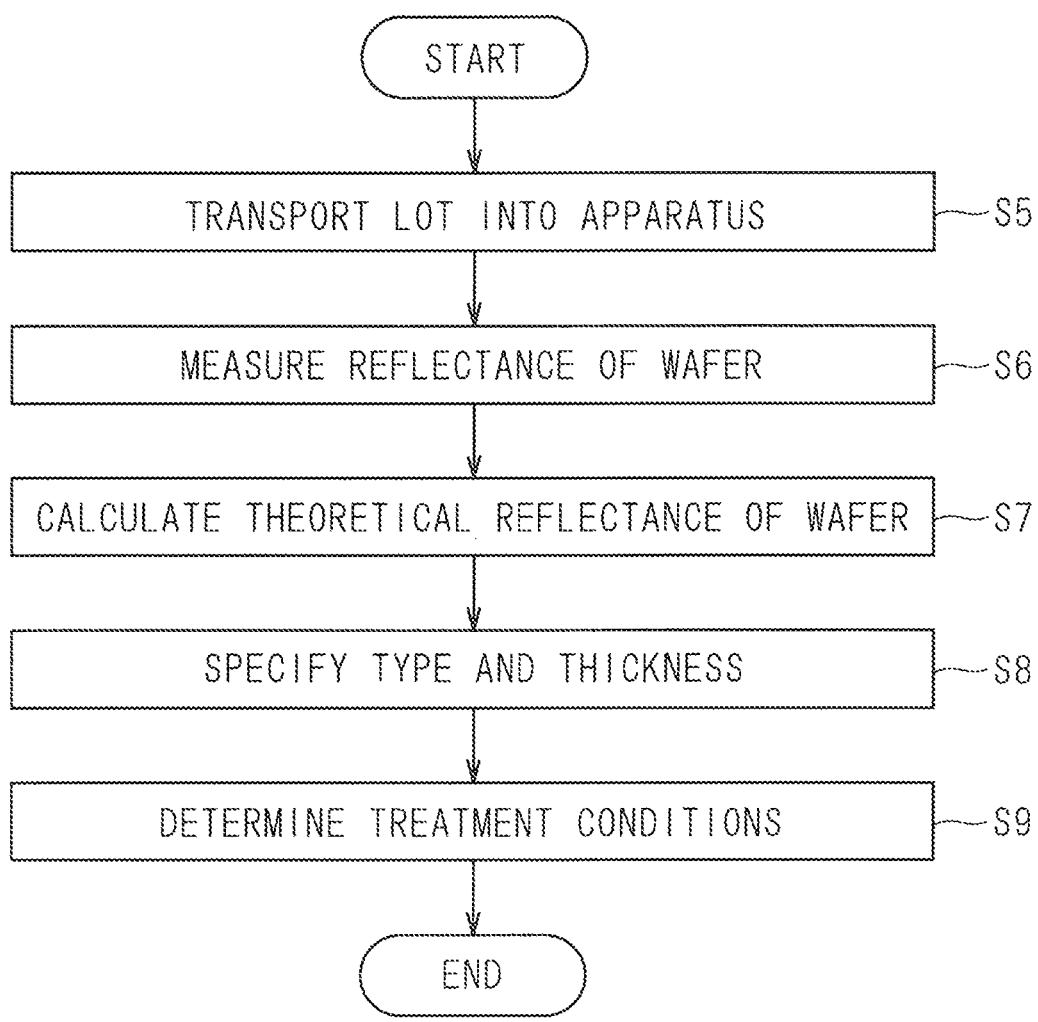

FIGS. 11 and 12 are flow diagrams showing procedures for specifying the type and thickness of a thin film formed on the front surface of a semiconductor wafer W. The procedure shown in FIG. 11 is a preparatory process prior to the transport of the semiconductor wafer W into the heat treatment apparatus 100. The procedure shown in FIG. 12 is a process after the transport of the semiconductor wafer W into the heat treatment apparatus 100.

First, reflectance simulation is performed on various thin films as the preparatory process (Step S1). Specifically, a simulator determines individual reflectances obtained when thin films of various types and of various thicknesses are formed on a silicon semiconductor substrate. The simulator is provided, for example, in a computer separately provided outside the heat treatment apparatus 100. When a thin film is formed on the silicon semiconductor substrate, the reflectance is theoretically determined from the wavelength of light, the thickness of the thin film, the refractive index thereof, and the extinction coefficient thereof. The refractive index and the extinction coefficient are optical constants dependent on the type of the thin film and the wavelength. Thus, the simulator is able to arithmetically determine the reflectance at a certain wavelength by designating the type and thickness of the thin film formed on the silicon semiconductor substrate. In the present preferred embodiment, when an operator designates the type and thickness of a thin film, the simulator determines the reflectance for each wavelength falling within a predetermined wavelength range (e.g., 0.1 to 1.0 μm). That is, the simulator determines a reflectance profile (spectral reflectance) in the predetermined wavelength range. By causing the simulator to perform an arithmetic computation process without designating the type and thickness, the simulator determines a reflectance profile of a silicon semiconductor substrate with no thin film formed thereon (i.e., a bare silicon wafer).

Figure 13:
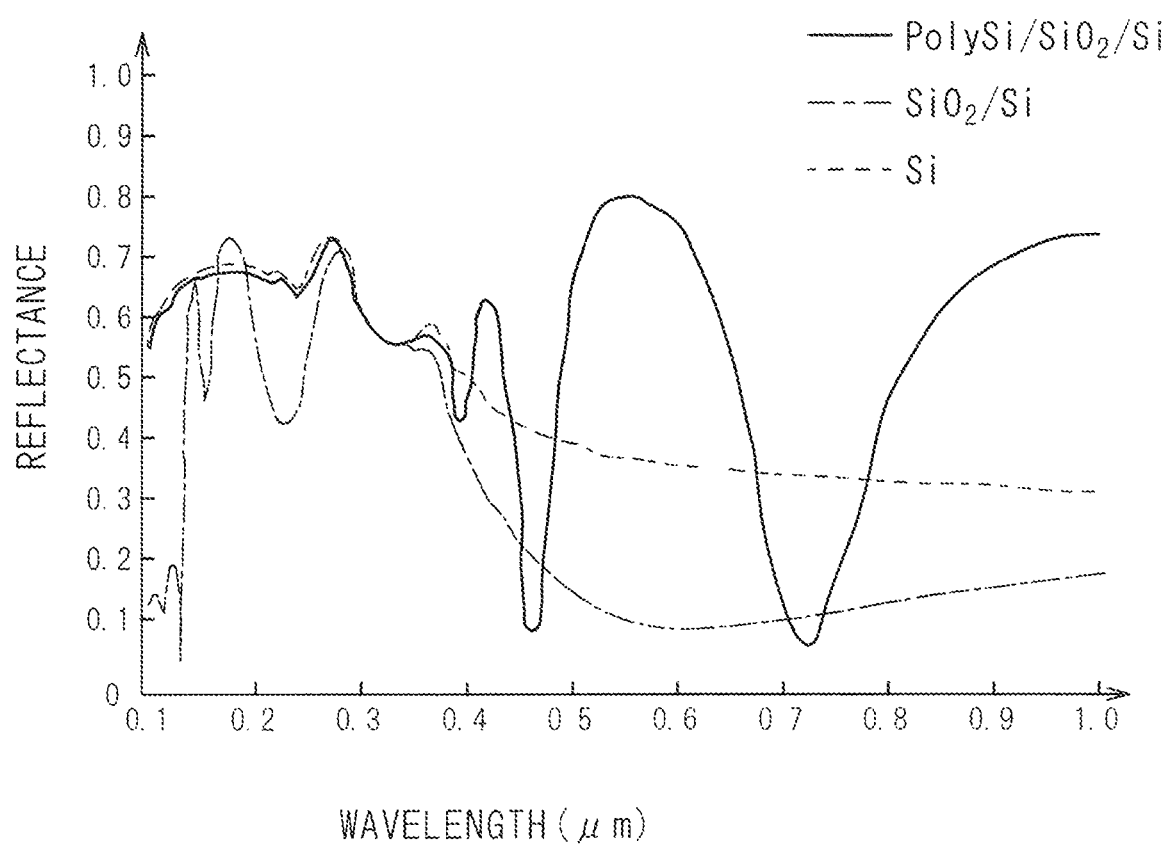
FIG. 13 is a graph showing examples of reflectance profiles obtained by simulation.

FIG. 13 is a graph showing examples of reflectance profiles obtained by the simulation in Step S1. In FIG. 13, a solid curve represents a reflectance profile obtained when a multi-layer film comprised of polysilicon having a thickness of 100 nm and silicon dioxide having a thickness of 100 nm is formed on a silicon substrate; a dot-and-dash curve represents a reflectance profile obtained when a thin film of silicon dioxide having a thickness of 100 nm is formed on a silicon substrate; and a dotted curve represents a reflectance profile of a bare silicon wafer with no thin film formed thereon. Although three types of reflectance profiles are illustrated in FIG. 13, reflectance profiles for further various thin films are determined by simulation. The reflectances determined in Step S1 are theoretical reflectances determined theoretically from the parameters such as the film thickness and the optical constants.

Next, a database of the reflectances determined in Step S1 is created (Step S2). In Step S2, the reflectance profiles determined in Step S1 and the types and thicknesses of the thin films set as simulation conditions are registered in association with each other into a database DB. The created database DB is stored on the magnetic disk 35 that is a storage part of the controller 3 (FIG. 10). The profiles of the theoretical reflectances determined by simulation for the silicon substrates on which the thin films of various types and of various thicknesses are formed are registered in the database DB.

Next, the reflectance of a bare silicon wafer is measured (Step S3). Specifically, the transfer robot 120 takes a bare silicon wafer out of a carrier C to transport the bare silicon wafer into the alignment chamber 231 of the alignment part 230. In the alignment chamber 231, the bare silicon wafer is supported by the rotary support part 237. Light emitted from the light emitting part 300 of the reflectance measuring part 232 is reflected by the half mirror 236, and is applied to the front surface of the bare silicon wafer at an incidence angle of 0°. The applied light from the light emitting part 300 is reflected from the front surface of the bare silicon wafer. The reflected light is transmitted through the half mirror 236, and is received by the light receiving part 235. The controller 3 divides the intensity of the light reflected from bare silicon wafer and received by the light receiving part 235 by the intensity of the light applied by the light emitting part 300 to calculate the reflectance of the front surface of the bare silicon wafer. The indexer part 101 may be provided with a load port for permanently installing thereon an exclusive carrier C containing only bare silicon wafers, so that the reflectance of a bare silicon wafer transported out of the exclusive carrier C is measured. Also, while a bare silicon wafer supported by the rotary support part 237 is rotated by the rotary motor 238, the reflectance of the bare silicon wafer may be measured.

The light emitting part 300 includes a plurality of light sources having different wavelength ranges, for example, to thereby emit light in a relatively wide wavelength range (e.g., 0.4 to 0.8 μm). The wavelength range of the light emanating from the light emitting part 300 is preferably matched to the wavelength range of the flashes of light emanating from the flash lamps FL. The light emitting part 300 emits light in a wavelength range having a certain width, whereby the reflectance measuring part 232 measures the spectral reflectance of the bare silicon wafer in that wavelength range. The measured reflectance is obtained by actually applying light to the bare silicon wafer in Step S3, whereas the theoretical reflectance of the bare silicon wafer is determined from the optical constants and the like in Step S1.

Next, the correlation acquiring part 37 of the controller 3 calculates a correlation coefficient between the theoretical reflectance and the measured reflectance for the bare silicon wafer (Step S4). In general, the measured reflectance does not completely agree with the theoretical reflectance due to structural factors of the alignment chamber 231 and optical properties of the reflectance measuring part 232. The correlation coefficient between the theoretical reflectance determined in Step S1 and the measured reflectance obtained in Step S3 is determined in Step S4. In the present preferred embodiment, the theoretical reflectance profile is determined in Step S1, and the reflectance profile is actually measured in Step S3. The reflectance profile refers to a profile of reflectances shown in succession for respective wavelengths in an appropriate wavelength range. Thus, the correlation acquiring part 37 calculates the correlation coefficient as a function of the wavelength. Specifically, the correlation acquiring part 37 calculates the correlation coefficient between the theoretical reflectance and the measured reflectance, based on:

$$R_i(w) = f(w) R_r(W) \tag{1}$$

where $R_i(w)$ is a theoretical reflectance of a bare silicon wafer which is determined depending on a wavelength w;

$R_r(w)$ is a measured reflectance of the bare silicon wafer which is determined depending on the wavelength w; and f(w) is a correlation coefficient between the theoretical reflectance and the measured reflectance which depend on the wavelength w. That is, the correlation acquiring part 37 calculates and acquires the correlation coefficient between the theoretical reflectance and the measured reflectance for each wavelength.

The aforementioned procedure shown in FIG. 11 is the preparatory process to be performed prior to the treatment of a semiconductor wafer W that becomes a product. The preparatory process need not be performed for each treatment of a semiconductor wafer W. It is sufficient to perform the preparatory process only once.

Subsequently, the procedure for specifying the type and thickness of a thin film formed on the front surface of a semiconductor wafer W to be treated will be described with reference to FIG. 12. First, a lot is transported into the heat treatment apparatus 100 (Step S5). The term "lot" refers to a group of semiconductor wafers W becoming subject to the same treatment under the same conditions. Specifically, multiple (in the present preferred embodiment, 25) semiconductor wafers W in a lot are placed on the load port 110 of the indexer part 101 while being stored in a carrier C.

Next, the reflectance of a semiconductor wafer W stored in the carrier C is measured (Step S6). The technique of measuring the reflectance of the semiconductor wafer W to be treated is the same as the aforementioned technique of measuring the reflectance of the bare silicon wafer. Specifically, the transfer robot 120 takes the semiconductor wafer W out of the carrier C to transport the semiconductor wafer W into the alignment chamber 231 of the alignment part 230. In the alignment chamber 231, the semiconductor wafer W is supported by the rotary support part 237. Light emitted from the light emitting part 300 of the reflectance measuring part 232 is reflected by the half mirror 236, and is applied to the front surface of the semiconductor wafer W at an incidence angle of 0°. The applied light from the light emitting part 300 is reflected from the front surface of the semiconductor wafer W. The reflected light is transmitted through the half mirror 236, and is received by the light receiving part 235. The controller 3 divides the intensity of the light reflected from the semiconductor wafer W and received by the light receiving part 235 by the intensity of the light applied by the light emitting part 300 to calculate the reflectance of the front surface of the semiconductor wafer W.

In the same manner as described above, the light emitting part 300 emits light in a wavelength range having a certain width, whereby the reflectance measuring part 232 measures the spectral reflectance of the semiconductor wafer W in that wavelength range. The reflectance measured in Step S6 is also the measured reflectance of the semiconductor wafer W acquired by actually applying light from the light emitting part 300 to the semiconductor wafer W.

Next, the reflectance calculating part 31 of the controller 3 calculates the theoretical reflectance of the semiconductor wafer W from the measured reflectance of the semiconductor wafer W to be treated (Step S7). The reflectance calculating part 31 multiplies the measured reflectance of the semiconductor wafer W obtained in Step S6 by the correlation coefficient f(w) determined in Step S4 to calculate the theoretical reflectance of the semiconductor wafer W. In Step S6, the spectral reflectance of the semiconductor wafer W is measured, and the correlation coefficient f(w) is a correlation coefficient between the theoretical reflectance and the measured reflectance for each wavelength. Thus, the theoretical reflectance of the semiconductor wafer W is calculated for each wavelength in Step S7. In other words, the theoretical spectral reflectance of the semiconductor wafer W is calculated in Step S7.

After the theoretical reflectance of the semiconductor wafer W is calculated from the measured reflectance thereof, the specifying part 36 of the controller 3 specifies the type and thickness of a thin film formed on the front surface of the semiconductor wafer W (Step S8). The specifying part 36 specifies the type and thickness of the thin film formed on the front surface of the semiconductor wafer W, based on the theoretical reflectance of the semiconductor wafer W determined in Step S7.

In Step S7, the theoretical spectral reflectance of the semiconductor wafer W, i.e. the theoretical reflectance profile of the semiconductor wafer W, is determined. This allows the specifying part 36 to perform pattern matching for the theoretical reflectance profile of the semiconductor wafer W determined in Step S7 upon the database DB in which multiple theoretical reflectance profiles are registered, thereby specifying the type and thickness of the thin film. More specifically, the specifying part 36 extracts a theoretical reflectance profile closely resembling the theoretical reflectance profile of the semiconductor wafer W determined in Step S7 from among the multiple theoretical reflectance profiles registered in the database DB. The extracted theoretical reflectance profile is associated with the type and thickness of a thin film in the database DB. The specifying part 36 specifies the type and thickness of that thin film as the type and thickness of the thin film formed on the front surface of the semiconductor wafer W. The type and thickness of the thin film specified by the specifying part 36 may be displayed on the display part 34.

Patterns as well as thin films are often formed on semiconductor wafers W to be treated as products. There are cases in which such patterns, if any, exert influence on measured reflectance profiles. It is difficult to achieve separation between the influence of thin films on the measured reflectances and the influence of patterns thereon. Thus, the theoretical reflectances calculated from the measured reflectances of patterned semiconductor wafers W deviate in some cases from the theoretical reflectances determined by simulation on the precondition that semiconductor wafers W are unpatterned.

In the present preferred embodiment, a patterned semiconductor wafer W is regarded as a semiconductor wafer W on which a thin film corresponding to the thin film of the type and thickness specified in Step S8 is formed on the assumption that the semiconductor wafer W is unpatterned. For example, when the theoretical reflectance profile calculated from the measured reflectances of a patterned semiconductor wafer W is close to the profile indicated by the dot-and-dash curve of FIG. 13, a thin film of silicon dioxide having a thickness of 100 nm is regarded as being formed on the front surface of that semiconductor wafer W. In the case of a patterned semiconductor wafer W, this causes a difference between the type and thickness of the thin film actually formed thereon and the type and thickness of the thin film regarded as being formed in the aforementioned manner in some cases. However, the final purpose is to select an optimum recipe to set treatment conditions. If the actually formed thin film and the thin film regarded as being formed differ from each other but show similar tendencies toward the theoretical spectral reflectance, the setting of optimum treatment conditions for the thin film regarded as being formed does not constitute a hindrance.

Next, the condition determining part 38 of the controller 3 determines treatment conditions for the semiconductor wafer W, based on the type and thickness of the thin film specified in Step S8 (Step S9). Specifically, the target temperature (the aforementioned treatment temperature T2) of the semiconductor wafer W during the flash heating is set, and the condition determining part 38 selects an optimum recipe which causes the temperature of the front surface of the semiconductor wafer W to exactly reach the target temperature, based on the type and thickness of the thin film specified in Step S8. The recipe refers to a list of specifications about treatment procedures and treatment conditions of heat treatment of the semiconductor wafers W. Examples of the treatment conditions include the charging voltage to the capacitors for supplying electric power to the flash lamps FL and the irradiation time period of the flash lamps FL. That is, the condition determining part 38 determines the optimum treatment conditions, based on the type and thickness of the thin film specified in Step S8. For a patterned semiconductor wafer W, the treatment conditions are determined, based on the type and thickness of the thin film regarded as being formed in Step S8.

The heat treatment apparatus 100 performs heat treatment on the semiconductor wafer W in accordance with the treatment conditions determined in this manner. This allows the heat treatment apparatus 100 to heat the semiconductor wafer W to the target temperature, thereby performing suitable treatment on the semiconductor wafer W.

In the preset preferred embodiment, the theoretical reflectance is calculated from the measured reflectance obtained by actually applying light to the semiconductor wafer W to be treated, and the type and thickness of the thin film formed on the front surface of the semiconductor wafer W are specified based on the theoretical reflectance. That is, the type and thickness of the thin film are specified by measuring the reflectance of the semiconductor wafer W transported into the heat treatment apparatus 100. This allows the type and thickness of the thin film formed on the front surface of the semiconductor wafer W to be checked even after the transport of the semiconductor wafer W into the heat treatment apparatus 100.

In the present preferred embodiment, both the measured reflectances and the theoretical reflectances are handled in the form of the reflectance profiles (spectral reflectances) each showing the reflectances in succession for respective wavelengths. As compared with the handling of the reflectances in the form of a single value (e.g., an average value), the expression of the reflectances in the form of a reflectance profile shows the state of reflection from the front surface of the semiconductor wafer W more precisely. In particular, the spectral distribution of radiation of the flash lamps FL is strong in visible light range, but ranges relatively widely from ultraviolet to near-infrared regions. Thus, more suitable treatment conditions adapted also to the spectral distribution of radiation of the flash lamps FL are determined by expressing and treating the measured reflectances and the theoretical reflectances in the form of the reflectance profiles.

While the preferred embodiment according to the present invention has been described hereinabove, various modifications of the present invention in addition to those described above may be made without departing from the scope and spirit of the invention. For example, the correlation coefficient is calculated from the measured reflectance and the theoretical reflectance of the bare silicon wafer in the aforementioned preferred embodiment, but may be calculated from the measured reflectance of a wafer (a reference substrate) with a theoretical reflectance previously known by simulation and the theoretical reflectance.

All of the semiconductor wafers W in a lot transported into the heat treatment apparatus 100 may be sequentially transported to the alignment chamber 231, subjected to the reflectance measurement, and returned once to a carrier C, and the heat treatment may be started after the procedure shown in FIG. 12 is executed upon all of the semiconductor wafers W. Alternatively, the procedure shown in FIG. 12 may be executed each time a semiconductor wafer W in a lot is transported to the alignment chamber 231 and subjected to the reflectance measurement, and the semiconductor wafer W may be transported from the alignment chamber 231 to the treatment chamber 6 and subjected to the heat treatment.

In Step S9, after the condition determining part 38 selects a recipe, the treatment conditions defined in the recipe may be corrected to optimum values, based on the specified type and thickness of the thin film.

In Step S8, the type and thickness of the thin film may be specified by theoretical calculation, based on the theoretical reflectance profile of the semiconductor wafer W.

If the type and thickness of the thin film specified in Step S8 differ from intended ones, an alarm may be issued.

In the aforementioned preferred embodiment, the reflectance measuring part 232 is provided in the alignment chamber 231. The present invention, however, is not limited to this. The reflectance measuring part 232 may be provided in any position (e.g., in the first cool chamber 131 or the second cool chamber 141) lying on the transport path of the semiconductor wafer W.

Although the 30 flash lamps FL are provided in the flash lamp house 5 according to the aforementioned preferred embodiment, the present invention is not limited to this. Any number of flash lamps FL may be provided. The flash lamps FL are not limited to the xenon flash lamps, but may be krypton flash lamps. Also, the number of halogen lamps HL provided in the halogen lamp house 4 is not limited to 40. Any number of halogen lamps HL may be provided.

In the aforementioned preferred embodiment, the filament-type halogen lamps HL are used as continuous lighting lamps that emit light continuously for not less than one second to preheat the semiconductor wafer W. The present invention, however, is not limited to this. In place of the halogen lamps HL, discharge type arc lamps (e.g., xenon arc lamps) may be used as the continuous lighting lamps to perform the preheating.

Moreover, a substrate to be treated by the heat treatment apparatus 100 is not limited to a semiconductor wafer, but may be a glass substrate for use in a flat panel display for a liquid crystal display apparatus and the like, and a substrate for a solar cell.

While the invention has been described in detail, the foregoing description is in all aspects illustrative and not restrictive. It is understood that numerous other modifications and variations can be devised without departing from the scope of the invention.

What is claimed is:

1. A method of heating a substrate by irradiating the substrate with a flash of light, said method comprising the steps of:
   (a) measuring a reflectance of a substrate to be treated;
   (b) calculating a theoretical reflectance of said substrate from said measured reflectance obtained in said step (a);
   (c) specifying the type and thickness of a thin film formed on a surface of said substrate, based on the theoretical reflectance calculated in said step (b); and (d) determining a correlation coefficient between a measured reflectance of a reference substrate with a theoretical reflectance previously known and the theoretical reflectance, wherein the theoretical reflectance of said substrate is calculated in said step (b), based on the measured reflectance obtained in said step (a) and said correlation coefficient (e) Heating the substrate by irradiating the substrate with a flash of light based on the type of thickness of the thin film specified in step (c).

2. The method according to claim 1, further comprising the step of (f) determining treatment conditions for said substrate, based on the type and thickness specified in said step (c).

3. A method of heating a substrate by irradiating the substrate with a flash of light, said method comprising the steps of:

(a) measuring a reflectance of a substrate to be treated;

(b) calculating a theoretical reflectance of said substrate from said measured reflectance obtained in said step (a);

(c) specifying the type and thickness of a thin film formed on a surface of said substrate, based on the theoretical reflectance calculated in said step (b); and (e) creating a database in which multiple theoretical reflectances obtained by calculating theoretical reflectances of a substrate with thin films of multiple types and thicknesses formed thereon are registered in association with the types and the thicknesses, wherein pattern matching for the theoretical reflectance calculated in said step (b) is performed on said database to specify the type and thickness of the thin film formed on the surface of said substrate in said step (c)

(f) Heating the substrate by irradiating the substrate with a flash of light based on the type of thickness of the thin film specified in step (c).

4. The method according to claim 3, wherein a thin film having properties corresponding to the type and thickness specified in said step (c) is regarded as being formed on the surface of said substrate that is patterned.

5. The method according to claim 3, further comprising the step of (g) determining treatment conditions for said substrate, based on the type and thickness specified in said step (c).

* * * * *